US012751014B2

(12) United States Patent
Yamazaki et al.

(10) Patent No.: US 12,751,014 B2
(45) Date of Patent: Sep. 29, 2026

(54) SEMICONDUCTOR DEVICE

(71) Applicant: Semiconductor Energy Laboratory Co., Ltd., Atsugi (JP)

(72) Inventors: Shunpei Yamazaki, Setagaya (JP); Tomoaki Atsumi, Hadano (JP); Yuta Endo, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 36 days.

(21) Appl. No.: 18/613,222

(22) Filed: Mar. 22, 2024

(65) Prior Publication Data

US 2024/0315038 A1 Sep. 19, 2024

Related U.S. Application Data

(63) Continuation of application No. 17/236,115, filed on Apr. 21, 2021, now Pat. No. 11,963,360, which is a (Continued)

(30) Foreign Application Priority Data

May 26, 2015 (JP) ................................ 2015-106145

(51) Int. Cl.

*H10B 43/35* (2023.01)
*G11C 16/04* (2006.01)
(Continued)

(52) U.S. Cl.

CPC ......... *H10B 43/35* (2023.02); *G11C 16/0466* (2013.01); *G11C 16/0483* (2013.01); (Continued)

(58) Field of Classification Search

CPC ........ H10B 43/35; H10B 43/27; H10B 43/40; G11C 16/0466; G11C 16/0483; G11C 16/10; G11C 16/26

See application file for complete search history.

(56) References Cited

U.S. PATENT DOCUMENTS

| | | | |
|---|---|---|---|
| 5,528,032 | A | 6/1996 | Uchiyama |
| 5,731,856 | A | 3/1998 | Kim et al. |

(Continued)

FOREIGN PATENT DOCUMENTS

| | | | |
|---|---|---|---|
| EP | 1737044 | A | 12/2006 |
| EP | 2226847 | A | 9/2010 |

(Continued)

OTHER PUBLICATIONS

Asakuma.N et al., "Crystallization and Reduction of Sol-Gel-Derived Zinc Oxide Films By Irradiation With Ultraviolet Lamp", Journal of Sol-Gel Science and Technology, 2003, vol. 26, pp. 181-184.

(Continued)

*Primary Examiner* — Jay C Kim

(74) *Attorney, Agent, or Firm* — Eric J. Robinson; Robinson Intellectual Property Law Office, P.C.

(57) ABSTRACT

A highly integrated semiconductor device is provided. The semiconductor device includes a substrate, a prism-like insulator, a memory cell string including a plurality of transistors connected in series. The prism-like insulator is provided over the substrate. The memory cell string is provided on the side surface of the prism-like insulator. The plurality of transistors each include a gate insulator and a gate electrode. The gate insulator includes a first insulator, a second insulator, and a charge accumulation layer. The charge accumulation layer is positioned between the first insulator and the second insulator.

4 Claims, 18 Drawing Sheets

Related U.S. Application Data continuation of application No. 15/159,021, filed on May 19, 2016, now abandoned.

(51) Int. Cl.
*H10B 43/27* (2023.01)
*H10B 43/40* (2023.01)
*G11C 16/10* (2006.01)
*G11C 16/26* (2006.01)

(52) U.S. Cl.
CPC ............. *H10B 43/27* (2023.02); *H10B 43/40* (2023.02); *G11C 16/10* (2013.01); *G11C 16/26* (2013.01)

(56) References Cited

U.S. PATENT DOCUMENTS 5,744,864 A 4/1998 Cillessen et al.
6,294,274 B1 9/2001 Kawazoe et al.
6,563,174 B2 5/2003 Kawasaki et al.
6,727,522 B1 4/2004 Kawasaki et al.
7,049,190 B2 5/2006 Takeda et al.
7,061,014 B2 6/2006 Hosono et al.
7,064,346 B2 6/2006 Kawasaki et al.
7,105,868 B2 9/2006 Nause et al.
7,211,825 B2 5/2007 Shih et al.
7,282,782 B2 10/2007 Hoffman et al.
7,297,977 B2 11/2007 Hoffman et al.
7,323,356 B2 1/2008 Hosono et al.
7,385,224 B2 6/2008 Ishii et al.
7,402,506 B2 7/2008 Levy et al.
7,411,209 B2 8/2008 Endo et al.
7,453,065 B2 11/2008 Saito et al.
7,453,087 B2 11/2008 Iwasaki
7,462,862 B2 12/2008 Hoffman et al.
7,468,304 B2 12/2008 Kaji et al.
7,501,293 B2 3/2009 Ito et al.
7,674,650 B2 3/2010 Akimoto et al.
7,696,063 B2 4/2010 Tsuchiya
7,696,559 B2 4/2010 Arai et al.
7,732,819 B2 6/2010 Akimoto et al.
7,781,827 B2 8/2010 Rao
7,800,091 B2 9/2010 Kamigaichi et al.
7,800,163 B2 9/2010 Izumi et al.
7,852,675 B2 12/2010 Maejima
7,875,922 B2 1/2011 Arai et al.
7,910,432 B2 3/2011 Tanaka et al.
7,936,004 B2 5/2011 Kito et al.
7,969,789 B2 6/2011 Katsumata et al.
7,983,084 B2 7/2011 Tokiwa et al.
8,008,710 B2 * 8/2011 Fukuzumi ............ H10D 30/697 257/326
8,013,317 B2 9/2011 Kiyotoshi
8,026,546 B2 9/2011 Murata et al.
8,048,798 B2 11/2011 Kidoh et al.
8,054,683 B2 11/2011 Tanaka et al.
8,148,769 B2 4/2012 Kito et al.
8,174,890 B2 5/2012 Maeda et al.
8,194,467 B2 6/2012 Mikajiri et al.
8,319,267 B2 11/2012 Kato et al.
8,331,149 B2 12/2012 Choi et al.
8,334,561 B2 12/2012 Fukuzumi et al.
8,335,111 B2 12/2012 Fukuzumi et al.
8,338,244 B2 12/2012 Son et al.
8,338,882 B2 12/2012 Tanaka et al.
8,349,681 B2 1/2013 Alsmeier et al.
8,351,277 B2 1/2013 Mikajiri et al.
8,410,538 B2 4/2013 Ishiduki et al.
8,421,071 B2 4/2013 Hatano
8,441,009 B2 5/2013 Ieda
8,455,868 B2 6/2013 Yamazaki et al.
8,455,941 B2 6/2013 Ishihara et al.
8,530,285 B2 9/2013 Yamazaki et al.
8,541,832 B2 9/2013 Kim et al.
8,559,235 B2 10/2013 Yoon et al.
8,569,823 B2 10/2013 Ino et al.
8,581,330 B2 11/2013 Kiyotoshi
8,592,873 B2 11/2013 Kim et al.
8,598,032 B2 12/2013 Chen et al.
8,654,567 B2 2/2014 Saito
8,654,584 B2 2/2014 Kim et al.
8,654,587 B2 2/2014 Yoon et al.
8,680,605 B2 3/2014 Jeon et al.
8,686,425 B2 4/2014 Yamazaki et al.
8,730,730 B2 5/2014 Koyama et al.
8,748,966 B2 6/2014 Whang et al.
8,766,351 B2 7/2014 Imamura. et al.
8,779,499 B2 * 7/2014 Kiyotoshi ............ H10D 30/689 438/137
8,785,923 B2 7/2014 Noda
8,809,870 B2 8/2014 Yamazaki et al.
8,809,992 B2 8/2014 Yamazaki et al.
8,828,884 B2 9/2014 Lee et al.
8,829,646 B2 9/2014 Lung et al.
8,830,757 B2 9/2014 Kito
8,837,225 B2 9/2014 Higuchi et al.
8,847,302 B2 9/2014 Alsmeier et al.
8,884,357 B2 11/2014 Wang et al.
8,908,431 B2 12/2014 Shim et al.
8,912,592 B2 12/2014 Lim et al.
8,916,424 B2 12/2014 Isobe et al.
8,946,023 B2 * 2/2015 Makala .................. H10D 88/00 438/261
8,958,246 B2 2/2015 Pan et al.
8,981,367 B2 3/2015 Yoneda et al.
8,982,626 B2 3/2015 Dong et al.
9,012,905 B2 4/2015 Yamazaki
9,012,974 B2 4/2015 Chae et al.
9,036,411 B2 5/2015 Itagaki
9,048,329 B2 6/2015 Kim et al.
9,053,807 B2 6/2015 Hashimoto
9,054,134 B2 6/2015 Yamazaki et al.
9,059,029 B2 6/2015 Arai
9,070,447 B2 6/2015 Chen
9,105,349 B2 * 8/2015 Avila ..................... G11C 29/04
9,165,651 B2 10/2015 Hosono
9,171,626 B2 10/2015 Goda et al.
9,171,948 B2 10/2015 Mori
9,183,893 B2 11/2015 Kanamori et al.
9,184,216 B2 11/2015 Park
9,196,628 B1 11/2015 Chen
9,196,629 B2 11/2015 Sakuma et al.
9,224,750 B1 12/2015 Yeh et al.
9,230,665 B2 1/2016 Hosono
9,230,983 B1 1/2016 Sharangpani et al.
9,230,987 B2 1/2016 Pachamuthu et al.
9,236,340 B2 1/2016 Lee et al.
9,245,642 B1 1/2016 Chen et al.
9,257,443 B1 2/2016 Kikushima et al.
9,257,552 B2 2/2016 Mizushima
9,281,414 B2 3/2016 Won et al.
9,293,592 B2 3/2016 Yamazaki
9,318,374 B2 4/2016 Atsumi et al.
9,324,446 B2 4/2016 Hishida et al.
9,349,735 B2 5/2016 Yamazaki et al.
9,349,849 B2 5/2016 Tanaka
9,368,508 B2 6/2016 Jee et al.
9,368,510 B1 6/2016 Rabkin et al.
9,397,115 B1 7/2016 Nozawa
9,419,058 B1 8/2016 Takaki et al.
9,449,982 B2 9/2016 Lu et al.
9,449,985 B1 9/2016 Rabkin et al.
9,515,080 B2 12/2016 Takahashi et al.
9,520,406 B2 12/2016 Makala et al.
9,530,514 B1 * 12/2016 Sabde .................. G11C 29/024
9,559,113 B2 1/2017 Lai
9,569,143 B1 * 2/2017 Sehgal ................... G11C 16/14
9,576,976 B1 2/2017 Hu et al.
9,583,350 B2 2/2017 Lai et al.
9,583,500 B2 2/2017 Pachamuthu et al.
9,601,591 B2 3/2017 Yamazaki
9,634,097 B2 4/2017 Rabkin et al.
9,685,452 B2 6/2017 Lee et al.
9,698,153 B2 7/2017 Liu et al.

(56) References Cited

U.S. PATENT DOCUMENTS

| | | | |
|---|---|---|---|
| 9,721,964 | B2 | 8/2017 | Lee |
| 9,735,014 | B2 | 8/2017 | Jung et al. |
| 9,748,262 | B1 | 8/2017 | Lai et al. |
| 9,761,604 | B2 | 9/2017 | Rabkin et al. |
| 9,818,757 | B2 | 11/2017 | Ikeda et al. |
| 9,842,851 | B2 | 12/2017 | Pachamuthu et al. |
| 9,859,207 | B2 | 1/2018 | Kim |
| 9,859,401 | B2 | 1/2018 | Yamazaki et al. |
| 9,991,265 | B2 | 6/2018 | Yamazaki et al. |
| 10,141,425 | B2 | 11/2018 | Yamazaki et al. |
| 10,164,009 | B1 | 12/2018 | Carlson |
| 10,217,736 | B2 | 2/2019 | Kato et al. |
| 10,361,290 | B2 | 7/2019 | Yamazaki et al. |
| 10,553,589 | B2 | 2/2020 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0278193 | A1 | 11/2009 | Murata et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0112769 | A1 | 5/2010 | Son et al. |
| 2011/0018051 | A1 | 1/2011 | Kim et al. |
| 2011/0103153 | A1 | 5/2011 | Katsumata et al. |
| 2011/0292731 | A1 | 12/2011 | Kim et al. |
| 2011/0298013 | A1 | 12/2011 | Hwang et al. |
| 2012/0001249 | A1 | 1/2012 | Alsmeier et al. |
| 2012/0032250 | A1 | 2/2012 | Son et al. |
| 2012/0098050 | A1 | 4/2012 | Shim et al. |
| 2012/0187397 | A1 | 7/2012 | Yamazaki et al. |
| 2012/0267699 | A1 | 10/2012 | Kiyotoshi |
| 2013/0270621 | A1 | 10/2013 | Mori |
| 2014/0197516 | A1 | 7/2014 | Lue et al. |
| 2014/0264525 | A1 | 9/2014 | Takahashi et al. |
| 2015/0118811 | A1 | 4/2015 | Makala et al. |
| 2015/0262674 | A1 | 9/2015 | Shirakawa |
| 2016/0064406 | A1 | 3/2016 | Natori et al. |
| 2016/0365407 | A1 | 12/2016 | Lue et al. |
| 2020/0176450 | A1 | 6/2020 | Yamazaki et al. |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 06-275697 | A | 9/1994 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2009-272513 | A | 11/2009 |
| JP | 2011-029586 | A | 2/2011 |
| JP | 2011-096340 | A | 5/2011 |
| JP | 2011-124563 | A | 6/2011 |
| JP | 2011-151383 | A | 8/2011 |
| JP | 2011-151389 | A | 8/2011 |
| JP | 2011-155249 | A | 8/2011 |
| JP | 2011-187794 | A | 9/2011 |
| JP | 2012-009512 | A | 1/2012 |
| JP | 2012-160721 | A | 8/2012 |
| JP | 2012-227326 | A | 11/2012 |
| JP | 2012-238763 | A | 12/2012 |
| JP | 2013-038124 | A | 2/2013 |
| JP | 2013-222785 | A | 10/2013 |
| JP | 2014-197444 | A | 10/2014 |
| JP | 2015-053336 | A | 3/2015 |
| JP | 2015-084418 | A | 4/2015 |
| JP | 2015-097262 | A | 5/2015 |
| WO | WO-2004/114391 | | 12/2004 |
| WO | WO-2010/106922 | | 9/2010 |
| WO | WO-2011/058864 | | 5/2011 |
| WO | WO-2011/077967 | | 6/2011 |
| WO | WO-2011/081009 | | 7/2011 |

(56) References Cited

FOREIGN PATENT DOCUMENTS

| | | |
|---|---|---|
| WO | WO-2014/164062 | 10/2014 |
| WO | WO-2014/164710 | 10/2014 |
| WO | WO-2015/126664 | 8/2015 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O Tfts", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "p. 29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2: Distinguished Paper: World-Largest (6.5") Flexible Full Color Top Emission Amoled Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384, Elsevier.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178, Elsevier.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355, Elsevier.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315, Elsevier.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide Tfts and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge To Future Displays: Transparent AM-OLED Driven By Peald Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven By the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

Block storing data to be deleted
(data"1" written)
BGL=$V_E$

Block from which data is not deleted
BGL=$V_E$

Writing operation 1

Writing operation 2

Writing operation 2n

Reading operation 1

Reading operation 2

Reading operation 2n

SEMICONDUCTOR DEVICE

BACKGROUND OF THE INVENTION

1. Field of the Invention

The present invention relates to, for example, a semiconductor, a transistor, and a semiconductor device. The present invention relates to, for example, a method for manufacturing a semiconductor, a transistor, and a semiconductor device. The present invention relates to, for example, a semiconductor, a display device, a light-emitting device, a lighting device, a power storage device, a memory device, a processor, and an electronic device. The present invention relates to a method for manufacturing a semiconductor, a display device, a liquid crystal display device, a light-emitting device, a memory device, and an electronic device. The present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

A memory device including a semiconductor has attracted attention as a high capacity memory device included in a computer and the like. In particular, it has been known that the integration degree of a NAND flash memory is easily heightened because the NAND flash memory has a small number of wirings or electrodes per memory cell. Storage capacity has been increased year by year because of realization of technology such as multivalued memory. In recent years, two-dimensional memory cell arrangement has approached limits on higher integration and is being replaced with technology of three-dimensional memory cell arrangement (see Patent Document 1).

REFERENCE

Patent Document

[Patent Document 1] Japanese Published Patent Application No. 2011-96340

SUMMARY OF THE INVENTION

An object is to provide a highly integrated semiconductor device. Another object is to provide a semiconductor device with three-dimensional memory cell arrangement. Another object is to provide a semiconductor device with large storage capacity. Another object is to provide a semiconductor device with a long retention period.

Another object is to provide a module including any of the above semiconductor devices. Another object is to provide an electronic device including any of the above semiconductor devices or the module. Another object is to provide a novel semiconductor device. Another object is to provide a novel module. Another object is to provide a novel electronic device.

Another object is to provide a transistor having normally-off electrical characteristics. Another object is to provide a transistor having a low leakage current in an off state. Another object is to provide a transistor having a small subthreshold swing value. Another object is to provide a transistor having a small short-channel effect. Another object is to provide a transistor having excellent electrical characteristics. Another object is to provide a transistor having high reliability. Another object is to provide a transistor with high frequency characteristics.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1)

One embodiment of the present invention is a semiconductor device that includes a substrate, a prism-like insulator, a memory cell string including a plurality of transistors connected in series. The prism-like insulator is provided over the substrate, and the memory cell string is provided on the side surface of the prism-like insulator.

(2)

One embodiment of the present invention is a semiconductor device that includes a substrate, a prism-like insulator, a plurality of memory cell strings. The plurality of memory cell strings each comprise a plurality of transistors connected in series. The prism-like insulator is provided over the substrate, and the plurality of memory cell strings each are provided on a side surface of the prism-like insulator.

(3)

One embodiment of the present invention is the semiconductor device according to (1) or (2), in which the plurality of transistors each include a gate insulator and a gate electrode, the gate insulator includes a first insulator, a second insulator, and a charge accumulation layer, and the charge accumulation layer is positioned between the first insulator and the second insulator.

(4)

One embodiment of the present invention is the semiconductor device according to any one of (1) to (3), in which the plurality of transistors include an oxide semiconductor.

(5)

One embodiment of the present invention is the semiconductor device according to (4), in which the oxide semiconductor contains indium, an element M (aluminum, gallium, yttrium, or tin), and zinc.

(6)

One embodiment of the present invention is the semiconductor device according to any one of (1) to (5) which further includes a first transistor and a second transistor provided over the substrate. A source terminal of the first transistor is electrically connected to a first terminal of the memory cell string and a drain terminal of the second transistor is electrically connected to a second terminal of the memory cell string.

(7)

One embodiment of the present invention is the semiconductor device according to (6), in which the first transistor and the second transistor include single crystal silicon.

A highly integrated semiconductor device can be provided. A semiconductor device with three-dimensional memory cell arrangement can be provided. A semiconductor device with large storage capacity can be provided. A semiconductor device with a long retention period can be provided.

A module including any of the above semiconductor devices can be provided. An electronic device including any of the above semiconductor devices or the module can be provided. A novel semiconductor device can be provided. A novel module can be provided. A novel electronic device can be provided.

A transistor having normally-off electrical characteristics can be provided. A transistor having a low leakage current in an off state can be provided. A transistor having a small subthreshold swing value can be provided. A transistor having a small short-channel effect can be provided. A transistor having excellent electrical characteristics can be provided. A transistor having high reliability can be provided. A transistor with high frequency characteristics can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1A:
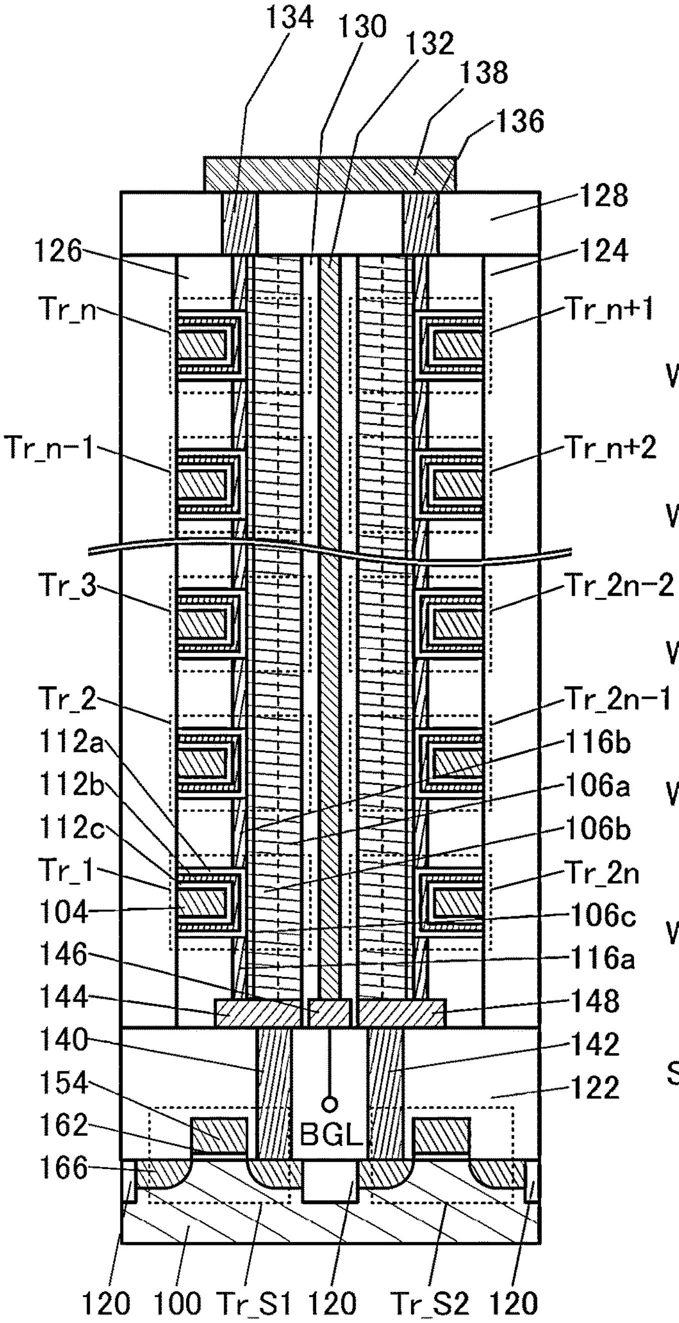
FIGS. 1A and 1B are a cross-sectional view and a circuit diagram of a semiconductor device of one embodiment of the present invention.

Embodiments of the present invention will be described in detail with reference to the drawings. However, the present invention is not limited to the description below, and it is easily understood by those skilled in the art that modes and details disclosed herein can be modified in various ways. Furthermore, the present invention is not construed as being limited to description of the embodiments. In describing structures of the invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

In this specification, the terms “film” and “layer” can be interchanged with each other.

A voltage usually refers to a potential difference between a given potential and a reference potential (e.g., a source potential or a ground potential (GND)). A voltage can be referred to as a potential and vice versa. In general, a potential (a voltage) is relative and is determined depending on the difference relative to a reference potential. Therefore, even a “ground potential,” for example, is not necessarily 0 V. For example, in some cases, a “ground potential” is the lowest potential in a circuit. In other cases, a “ground potential” is a moderate potential in a circuit. In those cases, a positive potential and a negative potential are set using the potential as a reference.

Note that the ordinal numbers such as “first” and “second” are used for convenience and do not denote the order of steps or the stacking order of layers. Therefore, for example, the term “first” can be replaced with the term “second,” “third,” or the like as appropriate. In addition, the ordinal numbers in this specification and the like do not correspond to the ordinal numbers which specify one embodiment of the present invention in some cases.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (hydrogen is included in water), lithium, sodium, silicon, boron, phosphorus, carbon, and nitrogen, for example. In the case of an oxide semiconductor, oxygen vacancy may be formed by entry of impurities such as hydrogen. Furthermore, in the case where the semiconductor is silicon, examples of an impurity which changes characteristics of the semiconductor include oxygen, Group 1 elements except hydrogen, Group 2 elements, Group 13 elements, and Group 15 elements.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be alternately referred to as the description "one of end portions of A is positioned on an outer side than one of end portions of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also indicates that the angle formed between two straight lines is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

<Semiconductor Device>

A semiconductor device of one embodiment of the present invention will be described below.

Note that the transistor is assumed to be of an n-channel type below. However, a term, a reference numeral, or the like may be replaced with an appropriate one in the following description when a p-channel transistor is used.

<Structure of Semiconductor Device>

An example of a structure of a semiconductor device of one embodiment of the present invention is shown below.

Figure 1B:
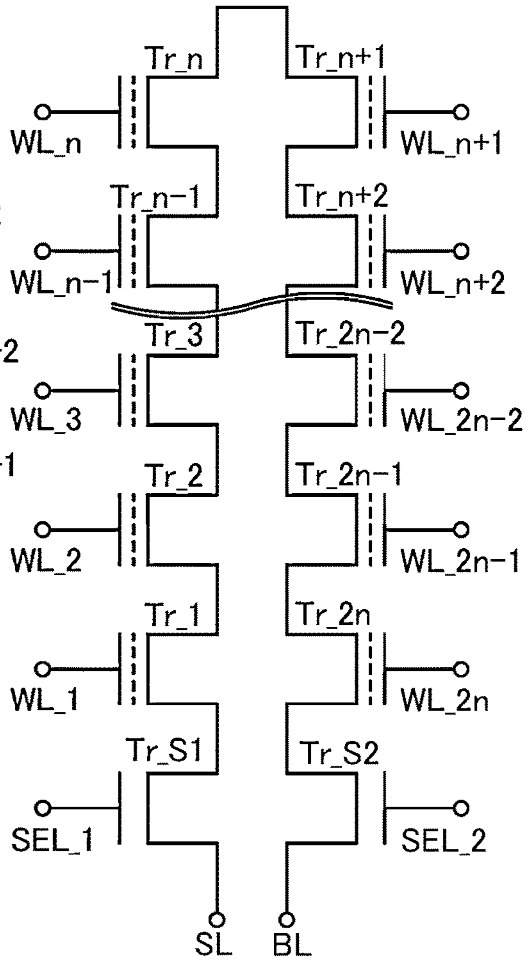

FIG. 1A is a cross-sectional view of a semiconductor device of one embodiment of the present invention. FIG. 1B is a circuit diagram of the semiconductor device in FIG. 1A.

The semiconductor device in FIG. 1A includes a substrate 100, an insulator 120, an insulator 122, an insulator 124, an insulator 126, an insulator 128, an insulator 130, a conductor 140, a conductor 142, a conductor 144, a conductor 146, a conductor 148, a conductor 132, a conductor 134, a conductor 136, a conductor 138, a transistor Tr_S1, a transistor Tr_S2, and transistors Tr_1 to Tr_2*n* (n is an integer of 2 or more).

The transistors Tr_S1 and Tr_S2 are provided to the substrate 100. Specifically, the transistor Tr_S1 includes a pair of impurity regions 166 provided in the substrate 100, a channel formation region placed between the impurity regions 166, a conductor 154 including a region overlapping with the channel formation region, and an insulator 162 placed between the channel formation region and the conductor 154. The conductor 154 has a function as a gate electrode and the insulator 162 has a function as a gate insulator. The conductor 154, which serves as a gate electrode of the transistor Tr_S1, is electrically connected to a wiring SEL_1. The conductor 154, which serves as a gate electrode of the transistor Tr_S2, is electrically connected to a wiring SEL_2. The transistor Tr_S2 has the same structure as that of the transistor Tr_S1, and the description of its structure is omitted; however, the transistor Tr_S2 may have a different structure. The transistors Tr_S1 and Tr_S2 are isolated by the insulator 120. As the element isolation method, a shallow trench isolation (STI) method, a local oxidation of silicon (LOCOS) method, or the like can be used. Note that the structures of the transistors Tr_S1 and Tr_S2 are not limited to the structures illustrated in FIG. 1A. For example, a transistor provided over a silicon on insulator (SOI) substrate or a FIN-type transistor may be used.

The insulator 122 is provided over the transistors Tr_S1 and Tr_S2. The insulator 130, and the conductors 144, 146, and 148 are provided over the insulator 122. The insulator 130 has a prism-like shape or a wall-like shape and is provided with the transistors Tr_1 to Tr_2*n* (n is an integer of 2 or more) on the sides thereof. Note that the channel length direction of each of the transistors Tr_1 to Tr_n is parallel to the direction perpendicular to a top surface of the substrate and the channel length direction of each of the transistors Tr_n+1 to Tr_2*n* is parallel to the direction perpendicular to the top surface of the substrate. Note that the insulator 130 does not necessarily have a prism-like shape or a wall-like shape, and may be a cylinder shape, for example. One side of the insulator 130 is provided with the transistors Tr_1 to Tr_n, and the other side is provided with the transistors Tr_n+1 to Tr_2*n*. The larger n is, the more highly integrated the semiconductor device is. For example, n may be 2, 4, 8, 16, 32, 64, or 128.

Note that the conductor 132 has a region facing the transistors Tr_1 to Tr_2*n* with the insulator 130 therebetween. The conductor 132 has a function as a back gate electrode of the transistors Tr_1 to Tr_2*n* (also referred to as a second gate electrode) and is electrically connected to a wiring BGL.

For example, the transistor Tr_1 includes an insulator 106*a*, a semiconductor 106*b*, an insulator 106*c*, a conductor 116*a*, a conductor 116*b*, an insulator 112*a*, a charge accumulation layer 112*b*, an insulator 112*c*, and a conductor 104. The insulator 106*a* is provided along the side of the insulator 130. The semiconductor 106*b* is provided along the side of the insulator 130 with the insulator 106*a* therebetween. The insulator 106*c* is provided along the side of the insulator 130 with the semiconductor 106*b* and the insulator 106*a* therebetween. The insulator 112*a*, the conductor 116*a*, and the conductor 116*b* each include a region facing the insulator 130 with the insulator 106*c*, the semiconductor 106*b*, and the insulator 106*a* therebetween. Note that the insulator 112*a* is placed between the conductor 116*a* and the conductor 116*b*. The charge accumulation layer 112*b* has a region facing the insulator 130 with the insulator 112*a*, the insulator 106*c*, the semiconductor 106*b*, and the insulator 106*a* therebetween. The insulator 112*c* has a region facing the insulator 130 with the charge accumulation layer 112*b*, the insulator 112*a*, the insulator 106*c*, the semiconductor 106*b*, and the insulator 106*a* therebetween. The conductor 104 has a region facing the insulator 130 with the insulator 112*c*, the charge accumulation layer 112*b*, the insulator 112*a*, the insulator 106*c*, the semiconductor 106*b*, and the insulator 106*a* therebetween.

Thus, in the transistor Tr_1, the semiconductor 106*b* has a function as a channel formation region, the conductor 104 has a function as a gate electrode, the insulator 112*a*, the charge accumulation layer 112*b*, and the insulator 112*c* each have a function as a gate insulator, the conductor 116*a* has a function as a source electrode, and the conductor 116*b* has a function as a drain electrode. The insulator 106*a* and the insulator 106*c* have functions of reducing the density of defect states at the interfaces between the semiconductor 106*b* and the insulator 106*a* and between the semiconductor 106*b* and the insulator 106*c*. Combination of materials used for the insulator 106*a*, the semiconductor 106*b*, and the insulator 106*c* will be described later. The conductor 104, which serves as the gate electrode of the transistor Tr_1, is electrically connected to a wiring WL_1. Note that the wiring WL_1 has a function as a word line. Note that the transistor Tr_1 is not limited to the structure illustrated in FIG. 1A. For example, some components such as the insulators 106*a* and 106*c* are not necessarily provided.

The transistor Tr_1 includes the charge accumulation layer 112*b* between the conductor 104 and the semiconductor 106*b*. Thus, the threshold voltage of the transistor Tr_1 corresponds to the polarity and amount of charge included in the charge accumulation layer 112*b*. The threshold voltage of the transistor Tr_1 can be controlled by the charge accumulation layer 112*b*; therefore, the transistor Tr_1 can serve as a memory cell (also referred to as a memory element) which stores data corresponding to the threshold voltage.

Figure 2A:
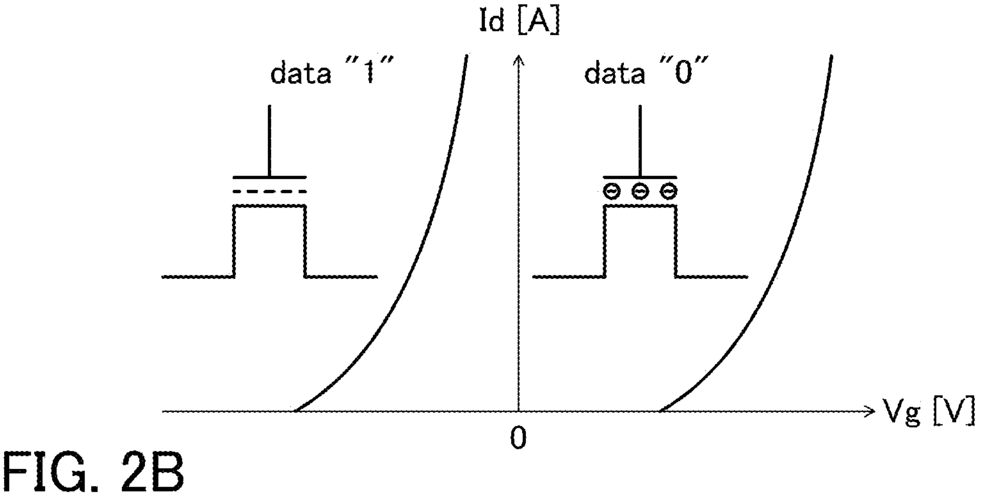
FIGS. 2A and 2B are a schematic view and a cross-sectional view illustrating operation of a semiconductor device of one embodiment of the present invention.
Figure 2B:
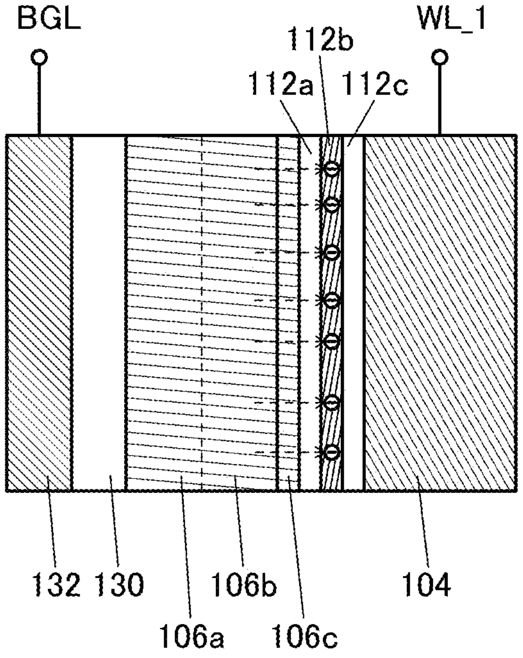

As shown in the left of FIG. 2A, the threshold voltage of the transistor Tr_1 is negative when electrons are not accumulated in the charge accumulation layer 112*b*. When electrons are accumulated in the charge accumulation layer 112*b* as shown in FIG. 2B, the threshold voltage changes to cancel an electric field generated by the electrons, and then the threshold voltage becomes positive as shown in the right of FIG. 2A. That is, the transistor Tr_1 takes data "1" because it is on when electrons are not accumulated in the charge accumulation layer 112*b*, and takes data "0" because of non-conduction when electrons are accumulated in the charge accumulation layer 112*b*. Although the description is about a two-valued memory cell here, a multivalued memory cell of three values or more (such as a four-valued, eight-valued, sixteen-valued, or thirty-two-valued memory cell) may be used. Note that electron injection into the charge accumulation layer 112*b* will be described later.

The transistors Tr_2 to Tr_2*n* have the same structures as that of the transistor Tr_1. Each of the gate electrodes of the transistors Tr_2 to Tr_2*n* is electrically connected to corresponding wirings WL_2 to WL_2*n*. The wirings WL_2 to WL_2*n* each have a function as a word line.

As described above, the transistors Tr_1 to Tr_2*n* each have a function as a memory cell. The transistors Tr_1 to Tr_2*n* are connected in series; thus, they can be collectively called one memory cell string. Memory cell strings can be arranged in matrix over the substrate 100, for example. Each of the memory cell strings is electrically connected to a selection transistor. Specifically, the memory cell strings are arranged over points of intersection of a plurality of straight lines extending in a first direction and a plurality of straight lines extending in a second direction over the substrate 100. The angle between the first direction and the second direction may be typically 45° or 90°. However, the angle may be in the range of greater than or equal to 10° and less than or equal to 90°, greater than or equal to 30° and less than or equal to 90°, greater than or equal to 45° and less than or equal to 90°, or greater than or equal to 60° and less than or equal to 90°, for example. The arrangement of the memory cell strings is preferably dense, and it depends on the shape of the memory cell strings. A wiring SL and a wiring BL provided along the first direction, for example, can be shared between the memory cell strings formed along the first direction. Note that the arrangement of the memory cell strings is not limited to a matrix arrangement. The wiring SL has a function as a source line. The wiring BL has a function as a bit line.

The plurality of memory cell strings are collectively called a block. One block is supposed to include a×b memory cell strings, a is the number of memory cell strings in the first direction (a is a natural number) and b is the number of memory cell strings in the second direction (b is a natural number). Note that the blocks may have different numbers of memory cell strings. A rule of how to form the blocks may be determined as appropriate. In a block, the wiring BGL is electrically connected to the conductor 132, for example. The conductors 132 are electrically isolated from the wirings BGL between the blocks. In one block, wirings WL_1 to WL_2*n* provided along the second direction, for example, can be shared between the memory cell strings formed along the second direction. The wirings WL_1 to WL_2*n* may be provided for each of the blocks or may be shared between the blocks arranged along the second direction. Memory cells sharing the wirings WL_1 to WL_2*n* are collectively called a page. Note that the wirings BL and SL can be shared between blocks arranged along the first direction.

A source terminal of the transistor Tr_S1 is electrically connected to the wiring SL, and its drain terminal of the transistor Tr_S1 is electrically connected to a first terminal of the memory cell string. A drain terminal of the transistor Tr_S2 is electrically connected to the wiring BL, and its source terminal of the transistor Tr_S2 is electrically connected to a second terminal of the memory cell string. The transistors Tr_S1 and Tr_S2 can be called selection transistors because the transistors control conduction or non-conduction between the memory cell string and the wirings.

The operations of writing and reading data to/from the semiconductor device shown in FIGS. 1A and 1B will be described below.

<Reset Operation>

Figure 3A:
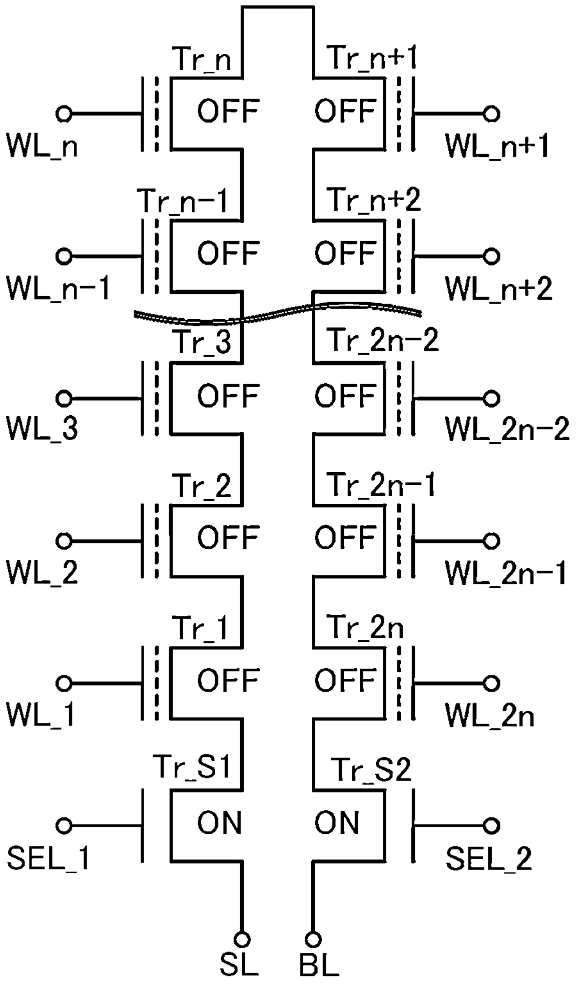
FIGS. 3A and 3B are circuit diagrams illustrating operation of a semiconductor device of one embodiment of the present invention.

When data is written to each of the memory cells, data is preferably deleted (data "1" is preferably written) in advance of the writing operation. The operation of deleting data is also referred to as a reset operation. The reset operation is performed in each block. For example, a reset operation can be performed in the following manner: a block storing data to be deleted is selected, an erasing potential $V_E$ (e.g., 15 V) is applied to the wiring BGL electrically connected to the conductor 132, a low potential (a potential such as 0 V, at which the transistors Tr_1 to Tr_2*n* are turned off) is applied to the wirings WL_1 to WL_2*n*, and the transistors Tr_S1 and Tr_S2 are turned on as shown in FIG. 3A. Note that when the conductor 132 is not provided, a reset operation can also be performed by an erasing potential $V_E$ applied to the wirings SL and BL. Electrons stored in the charge accumulation layer 112*b* of each of the transistors Tr_1 to Tr_2*n* can be extracted through the reset operation.

Figure 3B:
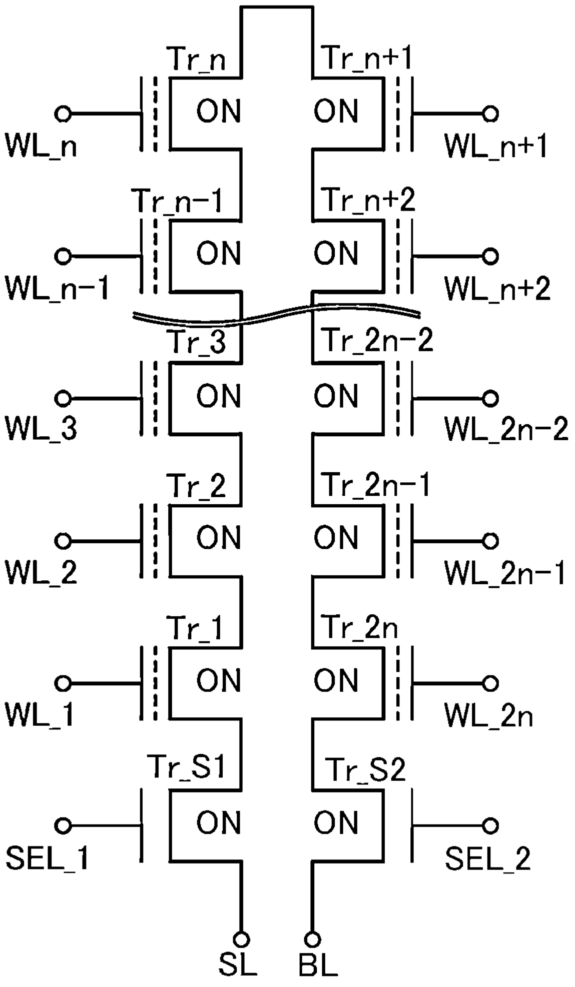

In a block from which data is not deleted, the electrical connection between the conductor 132 and the wiring BGL is cut off so that an erasing potential $V_E$ is not to be applied to the conductor 132. Alternatively, as shown in FIG. 3B, a potential such as an erasing potential $V_E$, at which the transistors Tr_1 to Tr_2*n* are turned on, may be applied to the wirings WL_1 to WL_2*n* electrically connected to a block from which data is not deleted. That is, the charge accumulation layer 112*b* is not applied with a difference in potential which leads electron extraction.

Note that data in a memory cell which is not subjected to rewriting is preferably stored in a different region in advance of the reset operation of the block.

<Writing operation>

Figure 4:
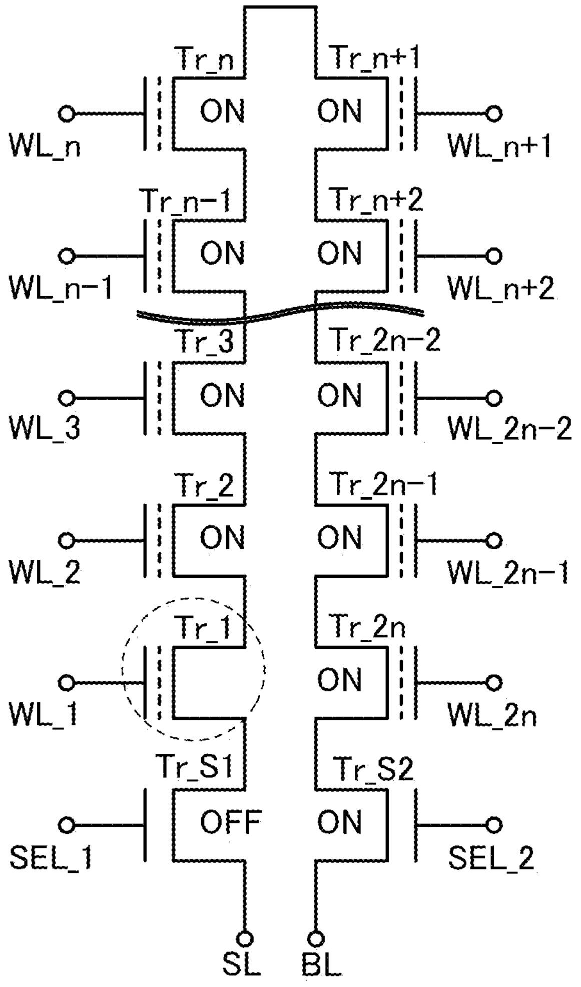
FIG. 4 is a circuit diagram illustrating operation of a semiconductor device of one embodiment of the present invention.
Figure 5:
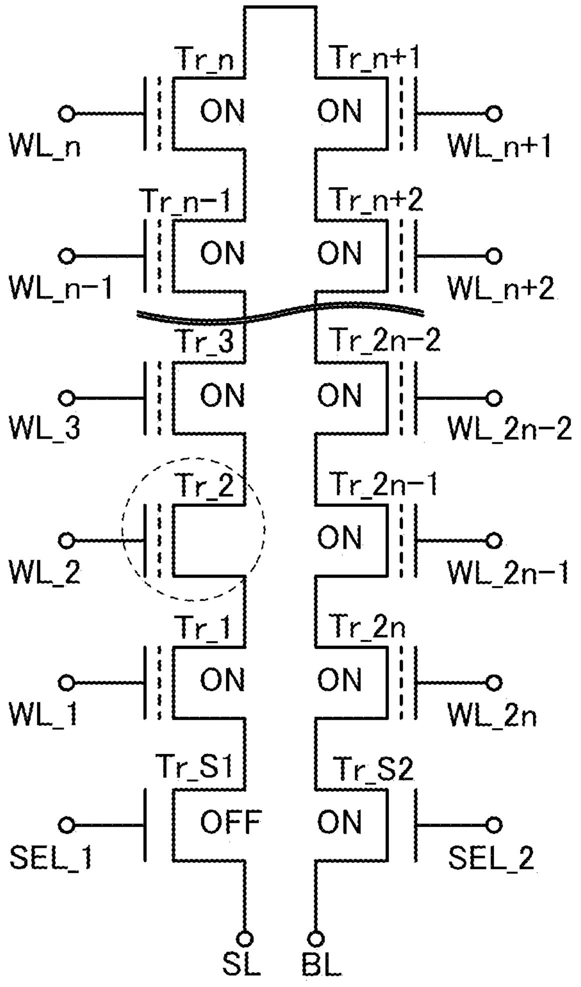
FIG. 5 is a circuit diagram illustrating operation of a semiconductor device of one embodiment of the present invention.
Figure 6:
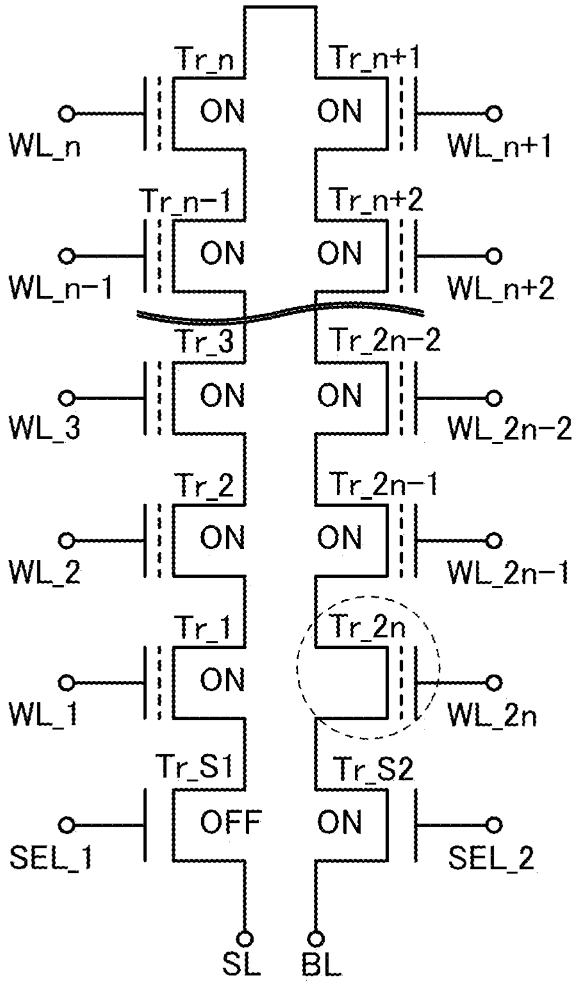
FIG. 6 is a circuit diagram illustrating operation of a semiconductor device of one embodiment of the present invention.

Next, a writing operation of data to each memory cell will be described with reference to FIGS. 4 to 6.

A writing operation of data can be performed for each of the above pages. First, a writing potential (e.g., 15 V) is applied to a word line of a page subjected to writing, and then a positive potential (a potential such as 3 V, at which a transistor is turned on) is applied to a word line of a page which is not subjected to writing. As shown in FIG. 4, a writing potential is applied to the wiring WL_1 first, and then positive potentials are applied to the wirings WL_2 to WL_2*n*. In addition, the transistor Tr_S1 electrically connected to the wiring SL is off, and the transistor Tr_S2 electrically connected to the wiring BL is on. Accordingly, a potential of the wiring BL is applied to the memory cell of the page subjected to writing. Data corresponding to the potential of the wiring BL is written to the memory cell. Specifically, when a potential of the wiring BL is a low potential such as 0 V, electrons are injected into the charge accumulation layer 112*b* because a difference between the potential of the wiring BL and the writing potential applied to the wiring WL_1 is increased. When the potential of the wiring BL is a positive potential, electrons are not injected into the charge accumulation layer 112*b* because a difference between the potential of the wiring BL and the writing potential applied to the wiring WL_1 is decreased. That is, data "0" is written to the memory cell when a low potential is applied to the wiring BL, and the memory cell keeps data "1" when a positive potential is applied.

Data writing can be performed page by page in such a manner that each of the wirings BL is applied with a potential required in the corresponding memory cell string. As shown in FIGS. 5 and 6, the same data writing is performed also for the wirings WL_2 to WL_2*n*, so that data writing can be performed for the block or the whole of the semiconductor device.

Note that data other than the data "0" or data "1" can also be written to the memory cell. For example, the amount of electrons injected into the charge accumulation layer 112*b* can be controlled on the basis of a potential of the wiring BL or the like or a potential applying period.

<Reading Operation>

Figure 7:
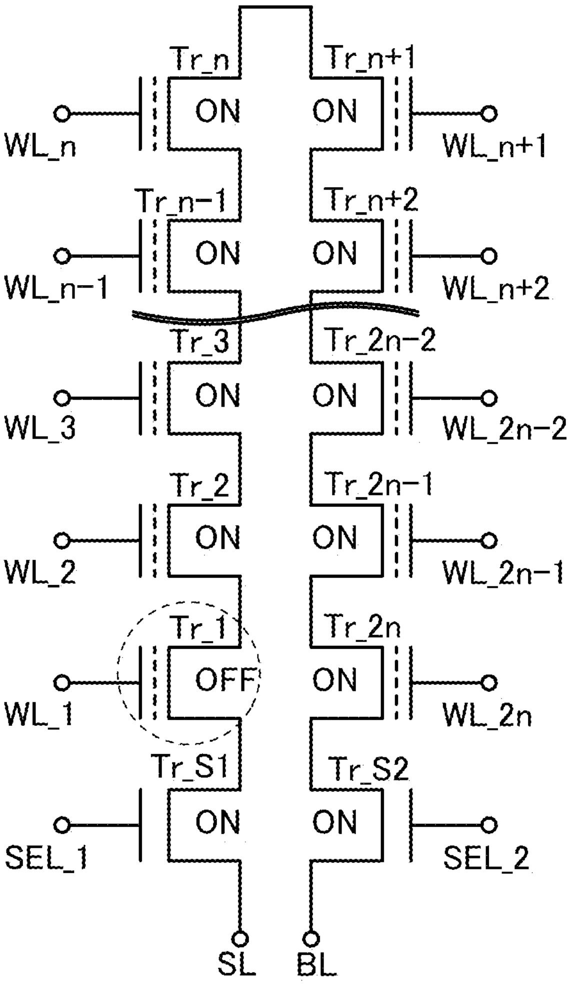
FIG. 7 is a circuit diagram illustrating operation of a semiconductor device of one embodiment of the present invention.
Figure 8:
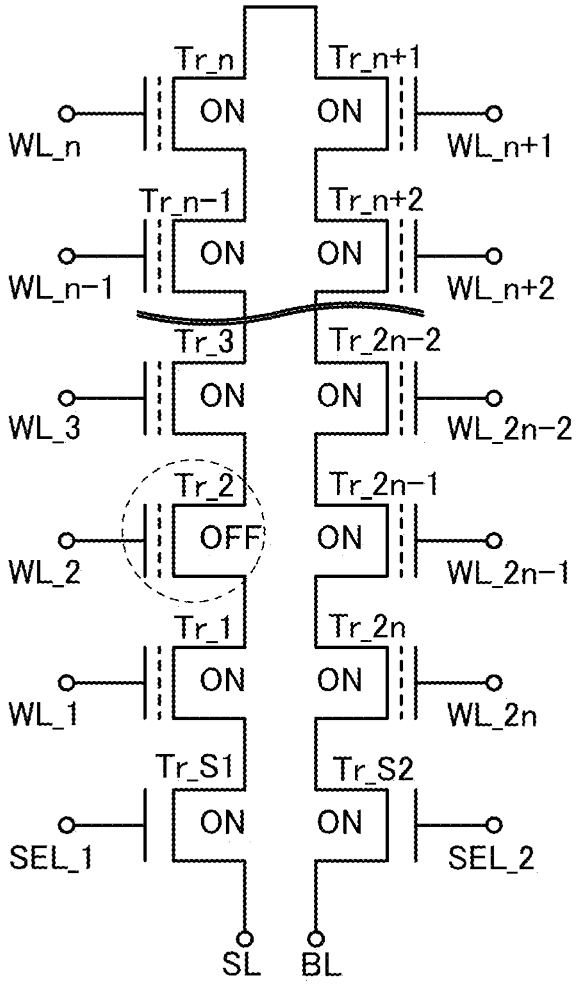
FIG. 8 is a circuit diagram illustrating operation of a semiconductor device of one embodiment of the present invention.
Figure 9:
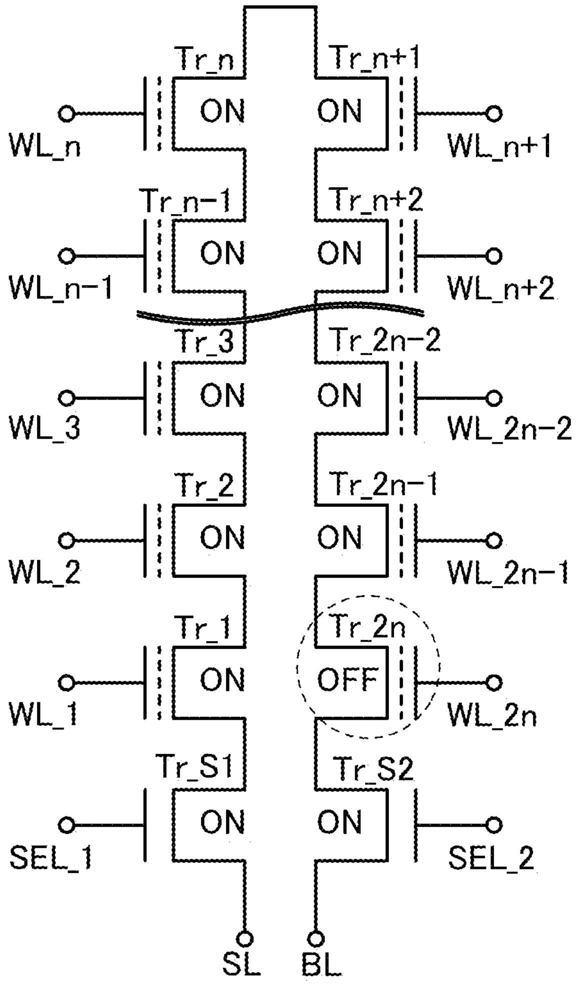
FIG. 9 is a circuit diagram illustrating operation of a semiconductor device of one embodiment of the present invention.

Next, a reading operation of data written in each memory cell will be described with reference to FIGS. 7 to 9.

A reading operation of data can also be performed for each of the pages. First, a low potential such as 0 V is applied to a word line of a page subjected to reading, and then a positive potential (a potential such as 3 V, at which a transistor is turned on) is applied to a word line of a page which is not subjected to reading. As shown in FIG. 7, a low potential is applied to the wiring WL_1 first, and then positive potentials are applied to the wirings WL_2 to WL_2*n*. In addition, the transistor Tr_S1 electrically connected to the wiring SL and the transistor Tr_S2 electrically connected to the wiring BL are on. A reading potential such as 1 V is applied to the wiring BL, and a low potential such as 0 V is applied to the wiring SL. At this time, a current is supplied to the memory cell string if the memory cell has data "1," and a current is not supplied to the memory cell string if the memory cell has data "0." Accordingly, data of the memory cell can be read by detection of the current value at that time or by detection of a potential drop of the wiring BL.

Data in each of the memory cell strings is output to the wiring BL; thus, data per page can be read. As shown in FIGS. 8 and 9, the same data reading is performed for the wirings WL_2 to WL_2*n*, so that data reading subjected to the block or the whole of the semiconductor device can be performed.

As described above, the semiconductor device of one embodiment of the present invention has high integration due to the three-dimensional arrangement of the memory cells. Thus, the semiconductor device has a large storage capacity per footprint. For example, the semiconductor device has a storage capacity of 1 Tbyte or more, 3 Tbyte or more, or 10 Tbyte or more. The semiconductor device can also be called a semiconductor device including a nonvolatile or substantially nonvolatile memory element because it can store data for a long period.

The semiconductor device of one embodiment of the present invention is suited for a storage device for computers because the semiconductor device is capable of rewriting and storing data for a long period, and has a large storage capacity. For example, the semiconductor device can be used in a main storage device (also referred to as a main memory or a memory) that stores data inside a computer, an external storage device (also referred to as a storage or a second storage device) that stores data outside a computer, or the like. Examples of the external storage device include a memory card and a solid state drive (SSD).

<Modification Example of Semiconductor Device>

Figure 10:
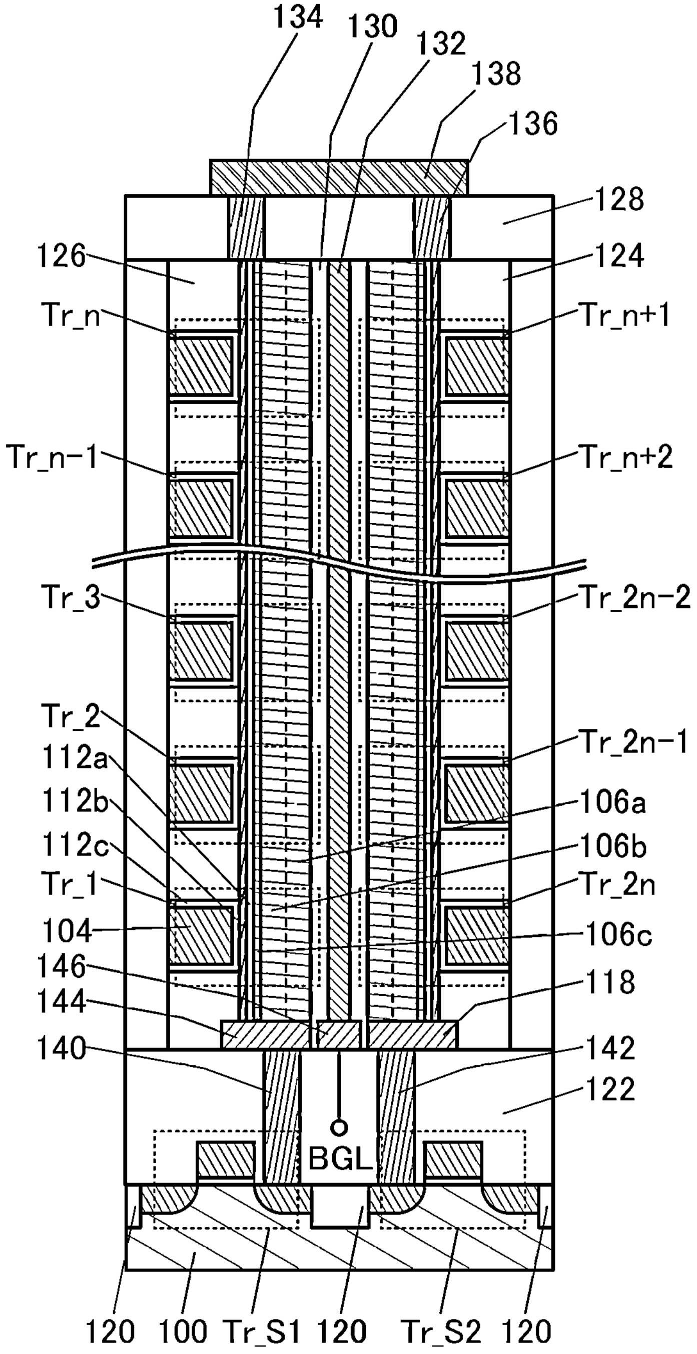
FIG. 10 is a cross-sectional view of a semiconductor device of one embodiment of the present invention.

The structure of the semiconductor device of one embodiment of the present invention is not limited to the structure in FIG. 1A. For example, the insulator 106*c* may be provided to have a shape along the insulator 130 with the semiconductor 106*b* and the insulator 106*a* therebetween as shown in FIG. 10. The insulator 112*a* may be provided to have a shape along the insulator 130 with the insulator 106*c*, the semiconductor 106*b*, and the insulator 106*a* therebetween. In addition, the charge accumulation layer 112*b* may be provided to have a shape along the insulator 130 with the insulator 112*a*, the insulator 106*c*, the semiconductor 106*b*, and the insulator 106*a* therebetween. The conductors 116*a* and 116*b* in FIG. 1A can be omitted.

Figure 11:
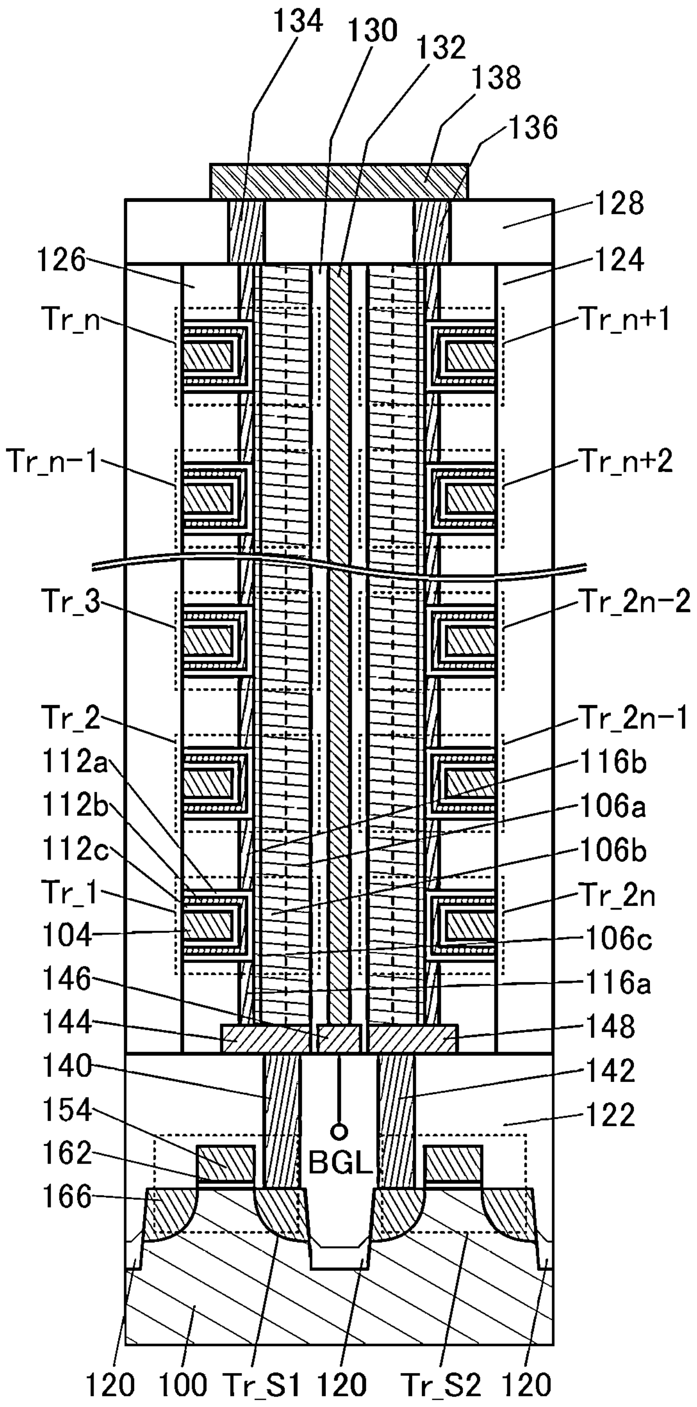
FIG. 11 is a cross-sectional view of a semiconductor device of one embodiment of the present invention.

The transistors Tr_S1 and Tr_S2 may be FIN-type transistors as shown in FIG. 11.

<Components of Semiconductor Device>

The components of the semiconductor device will be described below.

The insulators 120, 122, 124, 126, 128, and 130 may each be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used. Note that a "silicon oxynitride film" refers to a film that includes oxygen at a higher proportion than nitrogen, and a "silicon nitride oxide film" refers to a film that includes nitrogen at a higher proportion than oxygen.

Note that the insulators 120, 122, 124, 126, 128, and 130 have functions of isolating adjacent elements, wirings, and the like in some cases; thus, an insulator with a low dielectric constant is preferably used. For example, an insulator with a dielectric constant of 5 or lower, preferably 4 or lower, or further preferably 3 or lower is used. Specifically, an insulator containing silicon and oxygen or an insulator containing fluorine in addition to silicon and oxygen, or the like is preferably used. At least one of the insulators 120, 122, 124, 126, 128, and 130 may be a space.

At least one of the insulators 120, 122, 124, 126, 128, and 130 preferably contains an insulator having a function of blocking oxygen and impurities such as hydrogen (a function of not transmitting oxygen or impurities such as hydrogen). When an insulator that has a function of blocking oxygen and impurities such as hydrogen is placed near the transistors Tr_1 to Tr_2*n*, the electrical characteristics of the transistors Tr_1 to Tr_2*n* can be stable.

When the transistors Tr_1 to Tr_2*n* are transistors including an oxide semiconductor, it is preferable that the adjacent insulator 130 or/and insulator 126 be an insulator including excess oxygen. The excess oxygen can be used to reduce oxygen vacancy in the oxide semiconductor. Note that excess oxygen means oxygen in an insulator or the like which does not bond with (which is liberated from) the insulator or the like or has low bonding energy with the insulator or the like.

An insulator including excess oxygen may release oxygen, the amount of which is higher than or equal to $1\times10^{18}$ atoms/$cm^3$, higher than or equal to $1\times10^{19}$ atoms/$cm^3$, or higher than or equal to $1\times10^{20}$ atoms/$cm^3$ (converted into the number of oxygen atoms) in thermal desorption spectroscopy (TDS) analysis in the range of a surface temperature of 100° C. to 700° C. inclusive or 100° C. to 500° C. inclusive.

The method for measuring the amount of released oxygen using TDS analysis will be described below.

The total amount of gas released from a measurement sample in TDS analysis is proportional to the integral value of the ion intensity of the released gas. Then, comparison with a reference sample is made, whereby the total amount of released gas can be calculated.

For example, the number of oxygen molecules ($N_{O2}$) released from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that $CH_3OH$, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is not taken into consideration either because the proportion of such a molecule in the natural world is negligible.

$$N_{O2} = N_{H2}/S_{H2} \times S_{O2} \times \alpha$$

The value $N_{H2}$ is obtained by conversion of the number of hydrogen molecules desorbed from the reference sample into densities. The value $S_{H2}$ is the integral value of ion intensity when the reference sample is subjected to the TDS analysis. Here, the reference value of the reference sample is set to $N_{H2}/S_{H2}$. The value $S_{O2}$ is the integral value of ion intensity when the measurement sample is analyzed by TDS. The value $\alpha$ is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W, using a silicon substrate containing a certain amount of hydrogen atoms as the reference sample.

Furthermore, in the TDS analysis, oxygen is partly detected as an oxygen atom. The ratio between oxygen molecules and oxygen atoms can be calculated from the ionization rate of the oxygen molecules. Note that, since the above a includes the ionization rate of the oxygen molecules, the number of the released oxygen atoms can also be estimated through the measurement of the number of the released oxygen molecules.

Note that $N_{O2}$ is the number of the released oxygen molecules. The number of released oxygen in the case of being converted into oxygen atoms is twice the number of the released oxygen molecules.

Furthermore, an insulator from which oxygen is released by heat treatment may contain a peroxide radical. Specifically, the spin density attributed to the peroxide radical is greater than or equal to $5\times10^{17}$ spins/$cm^3$. Note that the insulator containing a peroxide radical may have an asymmetric signal with a g factor of approximately 2.01 in electron spin resonance (ESR).

In the case where the transistors Tr_S1 and Tr_S2 are silicon transistors including single crystal silicon, polycrystalline silicon, or the like, excess oxygen might be a factor in degrading the electrical characteristics. Accordingly, the insulator 122 preferably includes an insulator having a low oxygen-transmitting property so that the excess oxygen does not enter the transistors Tr_S1 or Tr_S2.

On the contrary, hydrogen can be used to terminate dangling bonds of silicon. Consequently, electrical characteristics of the transistors Tr_S1 and Tr_S2 can be improved. Note that hydrogen becomes a factor in degrading the electrical characteristics of the transistors Tr_1 to Tr_2*n* in some cases, so that the insulator 122 preferably includes an insulator having a low hydrogen-transmitting property.

Because of its small atomic radius or the like, hydrogen is likely to be diffused in an insulator (i.e., the diffusion coefficient of hydrogen is large). For example, a low-density insulator has a high hydrogen-transmitting property. In other words, a high-density insulator has a low hydrogen-transmitting property. The density of a low-density insulator is not always low throughout the insulator; an insulator including a low-density part is also referred to as a low-density insulator. This is because the low-density part serves as a hydrogen path. Although a density that allows hydrogen to be transmitted is not limited, it is typically lower than 2.6 g/$cm^3$. Examples of a low-density insulator include an inorganic insulator such as silicon oxide or silicon oxynitride and an organic insulator such as polyester, polyolefin, polyamide (e.g., nylon or aramid), polyimide, polycarbonate, or acrylic. Examples of a high-density insulator include magnesium oxide, aluminum oxide, germanium oxide, gallium oxide, yttrium oxide, zirconium oxide, lanthanum oxide, neodymium oxide, hafnium oxide, and tantalum oxide. Note that a low-density insulator and a high-density insulator are not limited to these insulators. For example, the insulators may contain one or more of boron, nitrogen, fluorine, neon, phosphorus, chlorine, and argon.

An insulator having crystal grain boundaries can have a high hydrogen-transmitting property. In other words, hydrogen is less likely to be transmitted through an insulator having no grain boundaries or few grain boundaries. For example, a non-polycrystalline insulator (e.g., an amorphous insulator) has a lower hydrogen-transmitting property than that of a polycrystalline insulator.

An insulator having a high hydrogen-bonding energy has a low hydrogen-transmitting property in some cases. For example, when an insulator which forms a hydrogen compound by bonding with hydrogen has bonding energy at which hydrogen is not released at temperatures in fabrication and operation of a device, the insulator can be in the category of an insulator having a low hydrogen-transmitting property. For example, an insulator which forms a hydrogen compound at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 20° C. and lower than or equal to 400° C., higher than or equal to 20° C. and lower than or equal to 300° C., or higher than or equal to 20° C. and lower than or equal to 200° C. has a high hydrogen-transmitting property in some cases. Hydrogen which is released easily and liberated can be referred to as excess hydrogen.

The charge accumulation layer 112*b* may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used.

The insulators 112*a* and 112*c* may each be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used.

The charge accumulation layer 112*b* is provided between the insulators 112*a* and 112*c*. The charge accumulation layer 112*b* has a function of accumulating electrons. For example, an insulator including an electron trap is suitable for the charge accumulation layer 112*b*. The electron trap can be formed by addition of impurities, application of damages, or the like. The electron trap may be formed at an interface between the charge accumulation layer 112*b* and the insulator 112*a* or at an interface between the charge accumulation layer 112*b* and the insulator 112*c*. In that case, junction of different kinds of materials is preferably formed between the charge accumulation layer 112*b* and the insulator 112*a* and between the charge accumulation layer 112*b* and the insulator 112*c*. When the interface between the charge accumulation layer 112*b* and the insulator 112*a* includes an electron trap, the insulator 112*c* is not necessarily provided in some cases. Alternatively, when the interface between the charge accumulation layer 112*b* and the insulator 112*c* includes an electron trap, the insulator 112*a* is not necessarily provided in some cases. Note that electrons are preferably less likely to move in the charge accumulation layer 112*b* because the charge accumulation layer 112*b* is shared with the adjacent memory cells. Note that when the adjacent memory cells and the charge accumulation layer 112*b* are separated, electrons can move in the charge accumulation layer 112*b*. That is, the charge accumulation layer 112*b* may be a semiconductor or a conductor.

The insulators 112*a* and 112*c* each preferably have a thickness which leads to electron tunneling by the gate voltage or the back gate voltage so that electrons are injected to the charge accumulation layer 112*b*. Note that, in order to prevent electron leakage during a time when the memory cell stores data, the thickness is preferably such a thickness that electron tunneling does not occur when the gate voltage or the back gate voltage is not applied. Note that it is difficult to totally eliminate electron tunneling; therefore, the insulators 112*a* and 112*c* may have a thickness at which data can be stored and electron tunneling does not occur. The thickness of the insulators 112*a* and 112*c* may be greater than or equal to 3 nm and less than or equal to 15 nm, preferably greater than or equal to 4 nm and less than or equal to 10 nm. An insulator with a large energy gap is preferably used so that electron leakage is prevented. The energy gaps of the insulators 112*a* and 112*c* are, for example, larger than or equal to 6 eV and smaller than or equal to 10 eV, preferably larger than or equal to 7 eV and smaller than or equal to 10 eV, further preferably larger than or equal to 8 eV and smaller than or equal to 10 eV.

Specifically, silicon nitride, silicon nitride oxide, or hafnium oxide that has high density of defect states is preferably used for the charge accumulation layer 112*b*. Silicon oxide or silicon oxynitride is preferably used for the insulators 112*a* and 112*c*.

The conductors 154, 140, 142, 144, 146, 148, 104, 116*a*, 116*b*, 132, 134, 136, and 138 each may be formed to have a single-layer structure or a stacked-layer structure including a conductor containing one or more kinds of, for example, boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 106*a*, the semiconductor 106*b*, and the insulator 106*c* will be described below.

Placing the insulator 106*a* under the semiconductor 106*b* and placing the insulator 106*c* over the semiconductor 106*b* can improve electrical characteristics of the transistor in some cases. The insulator 106*a*, the semiconductor 106*b*, and the insulator 106*c* each preferably include a CAAC-OS.

The semiconductor 106*b* is an oxide containing indium, for example. The semiconductor 106*b* can have high carrier mobility (electron mobility) by containing indium, for example. The semiconductor 106*b* preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M in some cases. The element M is an element having a high bonding energy with oxygen, for example. The element M is an element whose bonding energy with oxygen is higher than that of indium. The element M is an element that can increase the energy gap of the oxide, for example. Furthermore, the semiconductor **106*b*** preferably contains zinc. When containing zinc, the oxide is easily crystallized in some cases.

Note that the semiconductor **106*b* is not limited to the oxide containing indium. The semiconductor 106*b*** may be, for example, an oxide which does not contain indium and contains zinc, gallium, tin, or the like such as a zinc tin oxide or a gallium tin oxide.

The semiconductor **106*b* is formed using, for example, an oxide with a wide energy gap. For example, the energy gap of the semiconductor 106*b*** is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

The insulators **106*a* and 106*c* are each an oxide containing one or more or two or more elements contained in the semiconductor 106*b* other than oxygen, for example. Since the insulators 106*a* and 106*c* each contain one or more or two or more elements contained in the semiconductor 106*b* other than oxygen, a defect state is less likely to be formed at the interface between the insulator 106*a* and the semiconductor 106*b* and the interface between the semiconductor 106*b* and the insulator 106*c***.

The insulator **106*a*, the semiconductor 106*b*, and the insulator 106*c* preferably contain at least indium. In the case of using an In-M-Zn oxide as the insulator 106*a*, when the total proportion of In and M is assumed to be 100 atomic %, the proportions of In and M are preferably set to be less than 50 atomic % and greater than 50 atomic %, respectively, and further preferably less than 25 atomic % and greater than 75 atomic %, respectively. In the case of using an In-M-Zn oxide as the semiconductor 106*b*, when the total proportion of In and M is assumed to be 100 atomic %, the proportions of In and M are preferably set to be greater than 25 atomic % and less than 75 atomic %, respectively, and further preferably greater than 34 atomic % and less than 66 atomic %, respectively. In the case of using an In—M—Zn oxide as the insulator 106*c*, when the total proportion of In and M is assumed to be 100 atomic %, the proportions of In and M are preferably set to be less than 50 atomic % and greater than 50 atomic %, respectively, and further preferably less than 25 atomic % and greater than 75 atomic %, respectively. Note that the insulator 106*c* may be an oxide that is of the same type as the oxide of the insulator 106*a*. Note that the insulator 106*a* and/or the insulator 106*c* do/does not necessarily contain indium in some cases. For example, the insulator 106*a* and/or the insulator 106*c* may be gallium oxide. Note that the atomic ratio between the elements contained in the insulator 106*a*, the semiconductor 106*b*, and the insulator 106*c*** is not necessarily a simple integer ratio.

As the semiconductor **106*b*, an oxide having an electron affinity higher than those of the insulators 106*a* and 106*c* is used. For example, as the semiconductor 106*b*, an oxide having an electron affinity higher than those of the insulators 106*a* and 106*c*** by 0.07 eV or higher and 1.3 eV or lower, preferably 0.1 eV or higher and 0.7 eV or lower, and further preferably 0.15 eV or higher and 0.4 eV or lower is used. Note that the electron affinity refers to an energy difference between the vacuum level and the bottom of the conduction band.

An indium gallium oxide has a low electron affinity and a high oxygen-blocking property. Therefore, the insulator **106*c*** preferably includes an indium gallium oxide. The gallium atomic ratio [Ga/(In+Ga)] is, for example, higher than or equal to 70%, preferably higher than or equal to 80%, further preferably higher than or equal to 90%.

At this time, when gate voltage is applied, a channel is formed in the semiconductor **106*b* whose electron affinity is the highest among the insulator 106*a*, the semiconductor 106*b*, and the insulator 106*c***.

Figure 12:
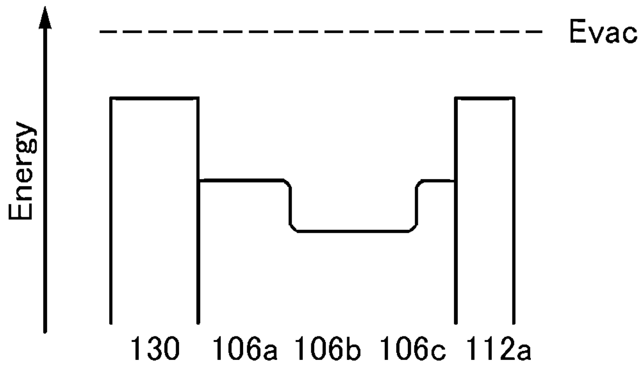
FIG. 12 is a band diagram of a channel formation region in a transistor of one embodiment of the present invention and its vicinity thereof.

Here, in some cases, there is a mixed region of the insulator **106*a* and the semiconductor 106*b* between the insulator 106*a* and the semiconductor 106*b*. Furthermore, in some cases, there is a mixed region of the semiconductor 106*b* and the insulator 106*c* between the semiconductor 106*b* and the insulator 106*c*. The mixed region has a low density of defect states. For that reason, the stack including the insulator 106*a*, the semiconductor 106*b*, and the insulator 106*c* has a band structure where energy is changed continuously at each interface and in the vicinity of the interface (continuous junction) (see FIG. 12). Note that boundaries of the insulator 106*a*, the semiconductor 106*b*, and the insulator 106*c*** are not clear in some cases.

At this time, electrons move mainly in the semiconductor **106*b*, but neither in the insulator 106*a* nor in the insulator 106*c*. Note that the insulator 106*a* and the insulator 106*c* can exhibit a property of any of a conductor, a semiconductor, and an insulator when existing alone. When the transistor operates, they each, however, have a region where a channel is not formed. Specifically, a channel is formed only in a region near the interface between the insulator 106*a* and the semiconductor 106*b* and a region near the interface between the insulator 106*c* and the semiconductor 106*b*, whereas a channel is not formed in the other region. Therefore, the insulator 106*a* and the insulator 106*c* can be called insulators when the transistor operates, and are thus referred to as, not semiconductors or conductors, but insulators in this specification. The insulator 106*a*, the semiconductor 106*b*, and the insulator 106*c* are separately called semiconductor or insulator only because of the relative difference in physical property. Therefore, for example, an insulator that can be used as the insulator 106*a* or the insulator 106*c* can be used as the semiconductor 106*b* in some cases. As described above, when the density of defect states at the interface between the insulator 106*a* and the semiconductor 106*b* and the density of defect states at the interface between the semiconductor 106*b* and the insulator 106*c* are decreased, electron movement in the semiconductor 106*b*** is less likely to be inhibited and the on-state current of the transistor can be increased.

As factors in inhibiting electron movement are decreased, the on-state current of the transistor can be increased. For example, in the case where there is no factor in inhibiting electron movement, electrons are assumed to be moved efficiently. Electron movement is also inhibited, for example, in the case where physical unevenness in a channel formation region is large.

To increase the on-state current of the transistor, for example, root mean square (RMS) roughness with a measurement area of 1 μm×1 μm of the top or bottom surface of the semiconductor **106*b* (a formation surface; here, the top surface of the insulator 106*a***) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (also referred to as P–V) with the measurement area of 1 μm×1 μm is less than 10 nm, preferably less than 9 nm, further preferably less than 8 nm, still further preferably less than 7 nm. RMS roughness, Ra, and P–V can be measured using, for example, a scanning probe microscope SPA-500 manufactured by SII Nano Technology Inc.

Moreover, the thickness of the insulator 106*c* is preferably as small as possible to increase the on-state current of the transistor. For example, the insulator 106*c* is formed to include a region having a thickness of less than 10 nm, preferably less than or equal to 5 nm, further preferably less than or equal to 3 nm. Meanwhile, the insulator 106*c* has a function of blocking entry of elements other than oxygen (such as hydrogen and silicon) included in the adjacent insulator into the semiconductor 106*b* where a channel is formed. For this reason, it is preferable that the insulator 106*c* have a certain thickness. For example, the insulator 106*c* is formed to include a region having a thickness of greater than or equal to 0.3 nm, preferably greater than or equal to 1 nm, further preferably greater than or equal to 2 nm. The insulator 106*c* preferably has an oxygen blocking property to suppress outward diffusion of oxygen released from the other insulators.

To improve reliability, the insulator 106*a* is preferably thick and the insulator 106*c* is preferably thin. For example, the insulator 106*a* includes a region with a thickness of, for example, greater than or equal to 10 nm, preferably greater than or equal to 20 nm, further preferably greater than or equal to 40 nm, still further preferably greater than or equal to 60 nm. When the thickness of the insulator 106*a* is made large, a distance from an interface between the adjacent insulator and the insulator 106*a* to the semiconductor 106*b* in which a channel is formed can be large. Since the productivity of the semiconductor device might be decreased, the insulator 106*a* has a region with a thickness of, for example, less than or equal to 200 nm, preferably less than or equal to 120 nm, further preferably less than or equal to 80 nm.

For example, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided, for example, between the semiconductor 106*b* and the insulator 106*a*. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 106*b* and the insulator 106*c*.

The semiconductor 106*b* includes a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$. It is preferable to reduce the hydrogen concentration in the insulator 106*a* and the insulator 106*c* in order to reduce the hydrogen concentration in the semiconductor 106*b*. The insulator 106*a* and the insulator 106*c* each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$. The semiconductor 106*b* includes a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, and still further preferably higher than or equal to $1\times10^{15}$ atoms/cm$^3$ and lower than or equal to $5\times10^{17}$ atoms/cm$^3$. It is preferable to reduce the nitrogen concentration in the insulator 106*a* and the insulator 106*c* in order to reduce the nitrogen concentration in the semiconductor 106*b*. The insulator 106*a* and the insulator 106*c* each include a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, and still further preferably higher than or equal to $1\times10^{15}$ atoms/cm$^3$ and lower than or equal to $5\times10^{17}$ atoms/cm$^3$.

The above three-layer structure is an example. For example, a two-layer structure including the semiconductor 106*b* and the insulator 106*a* or including the semiconductor 106*b* and the insulator 106*c* may be employed. A four-layer structure in which any one of the semiconductors described as examples of the insulator 106*a*, the semiconductor 106*b*, and the insulator 106*c* is provided under or over the insulator 106*a* or under or over the insulator 106*c* may be employed. An n-layer structure (n is an integer of 5 or more) may be employed in which one of the semiconductors described as examples of the insulator 106*a*, the semiconductor 106*b*, and the insulator 106*c* is provided at two or more of the following positions: over the insulator 106*a*, under the insulator 106*a*, over the insulator 106*c*, and under the insulator 106*c*.

<Composition>

The composition of an In-M-Zn oxide will be described below. The element M is aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like.

Figure 13:
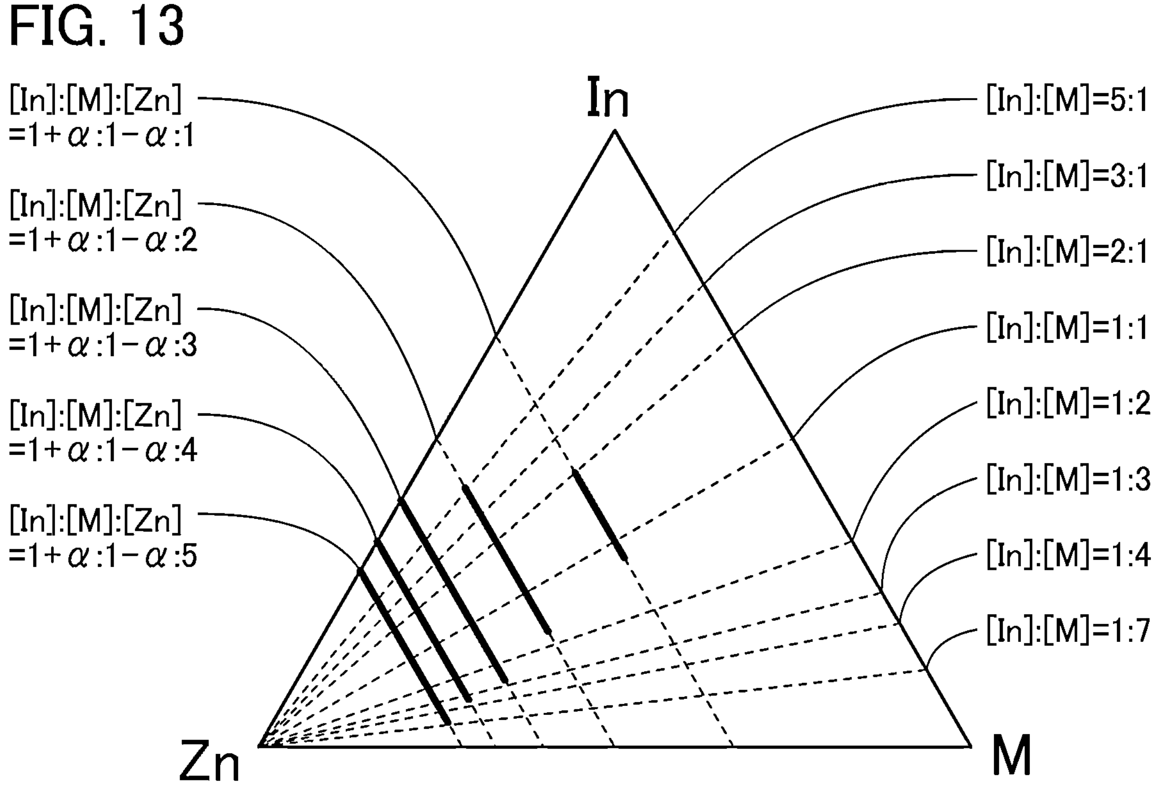
FIG. 13 is a triangular diagram for explaining composition of an In—M—Zn oxide.

FIG. 13 is a triangular diagram whose vertices represent In, M, and Zn. In the diagram, [In] means the atomic concentration of In, [M] means the atomic concentration of the element M, and [Zn] means the atomic concentration of Zn.

A crystal of an In-M-Zn oxide is known to have a homologous structure and is represented by $InMO_3(ZnO)_m$ (m is a natural number). Since In and M can be interchanged, the crystal can also be represented by $In_{1+\alpha}M_{1-\alpha}O_3(ZnO)_m$ ($-1\leq\alpha\leq1$). This composition is represented by any of the dashed lines denoted as [In]:[M]:[Zn]=1+α:1−α:1, [In]:[M]:[Zn]=1+α:1−α:2, [In]:[M]:[Zn]=1+α:1−α:3, [In]:[M]:[Zn]=1+α:1−α:4, and [In]:[M]:[Zn]=1+α:1−α:5. Note that the bold lines on the dashed lines represent, for example, the compositions that each allow oxides (raw materials) to be a solid solution when the oxides are mixed and subjected to baking at 1350° C.

Thus, when an oxide has a composition close to the above composition that allows the oxide to be a solid solution, the crystallinity can be increased. When an In-M-Zn oxide is deposited by a sputtering method, the composition of a target is different from the composition of the deposited film in some cases. For example, using an In-M-Zn oxide in which an atomic ratio is 1:1:1, 1:1:1.2, 3:1:2, 4:2:4.1, 1:3:2, 1:3:4, or 1:4:5 as a target results in a film having an atomic ratio of 1:1:0.7 (approximately 1:1:0.5 to 1:1:0.9), 1:1:0.9 (approximately 1:1:0.8 to 1:1:1.1), 3:1:1.5 (approximately 3:1:1 to 3:1:1.8), 4:2:3 (approximately 4:2:2.6 to 4:2:3.6), 1:3:1.5 (approximately 1:3:1 to 1:3:1.8), 1:3:3 (approximately 1:3:2.5 to 1:3:3.5), or 1:4:4 (approximately 1:4:3.4 to 1:4:4.4). Thus, in order to obtain a film with a desired composition, a composition of a target may be selected in consideration of a change in the composition.

<Structure of Oxide Semiconductor>

The structure of an oxide semiconductor will be described below.

An oxide semiconductor is classified into a single crystal oxide semiconductor and the other, a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and the other, a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Figure 14A:
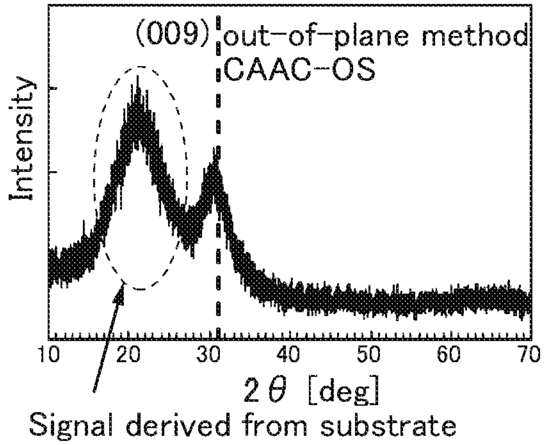
FIGS. 14A to 14E show structural analysis of a CAAC-OS and a single crystal oxide semiconductor by XRD and selected-area electron diffraction patterns of a CAAC-OS.

Analysis of a CAAC-OS by X-ray diffraction (XRD) will be described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 14A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferable that the CAAC-OS do not show the peak.

Figure 14B:
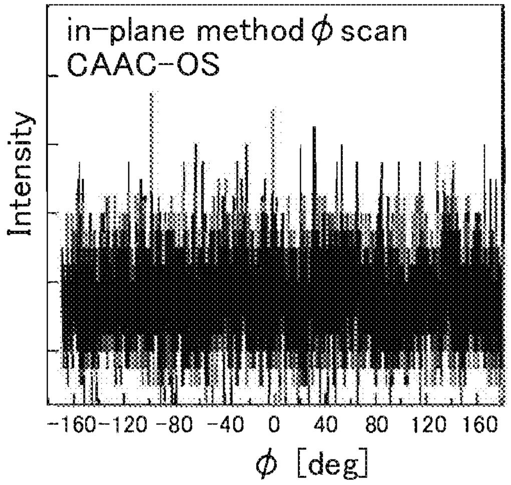
Figure 14C:
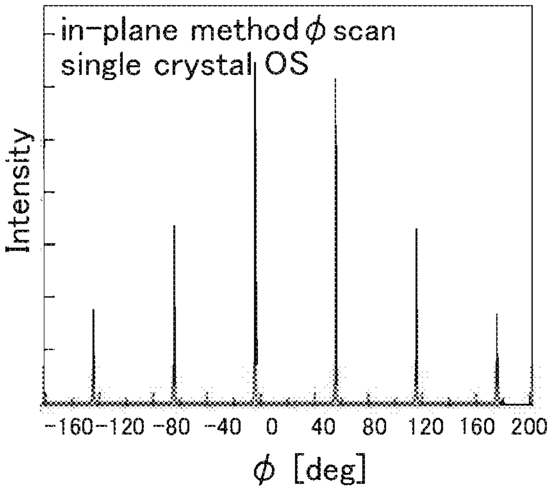

On the other hand, in structural analysis of the CAAC-OS by an in-plane method in which an X-ray is incident on the CAAC-OS in a direction parallel to the formation surface, a peak appears at a 2θ of around 56°. This peak is derived from the (110) plane of the $InGaZnO_4$ crystal. When analysis (ϕ scan) is performed with 2θ fixed at around 56° and with the sample rotated using a normal vector to the sample surface as an axis (ϕ axis), as shown in FIG. 14B, a peak is not clearly observed. In contrast, in the case where single crystal $InGaZnO_4$ is subjected to ϕ scan with 2θ fixed at around 56°, as shown in FIG. 14C, six peaks which are derived from crystal planes equivalent to the (110) plane are observed. Accordingly, the structural analysis by XRD shows that the directions of a-axes and b-axes are irregularly oriented in the CAAC-OS.

Figure 14D:
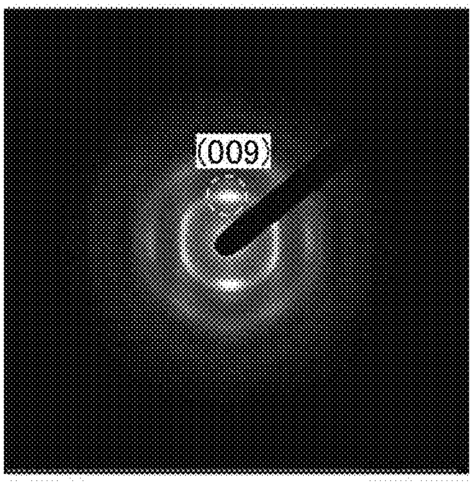
Figure 14E:
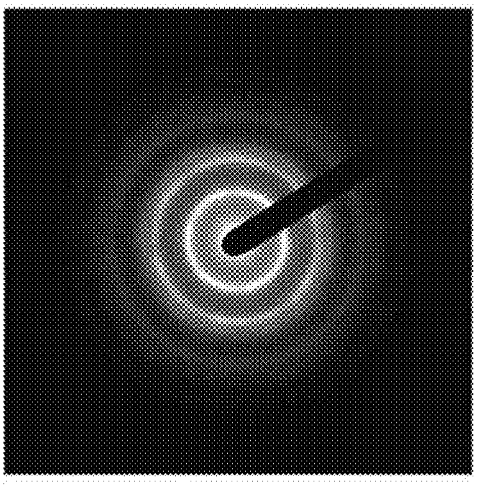

Next, a CAAC-OS analyzed by electron diffraction will be described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 14D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 14E shows a diffraction pattern obtained in such a manner that an electron beam with a probe diameter of 300 nm is incident on the same sample in a direction perpendicular to the sample surface. As shown in FIG. 14E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 14E is considered to be derived from the (010) plane, the (100) plane, and the like of the $InGaZnO_4$ crystal. The second ring in FIG. 14E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 15A:
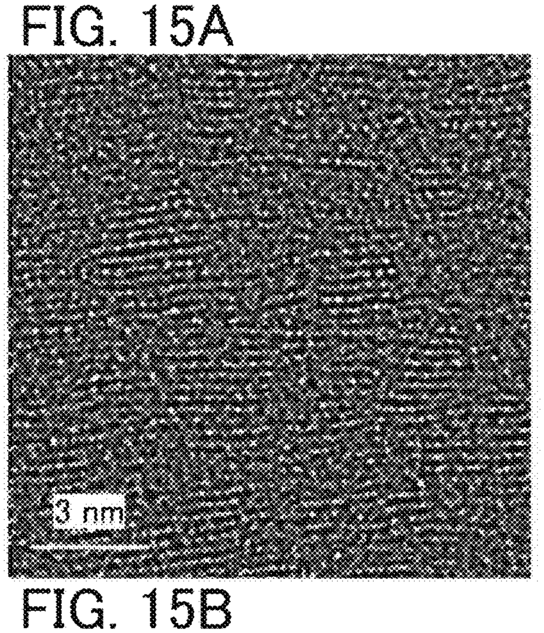
FIGS. 15A to 15E show a cross-sectional TEM image and plan-view TEM images of a CAAC-OS and images obtained through analysis thereof.

FIG. 15A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 15A shows pellets in which metal atoms are arranged in a layered manner. FIG. 15A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 15B:
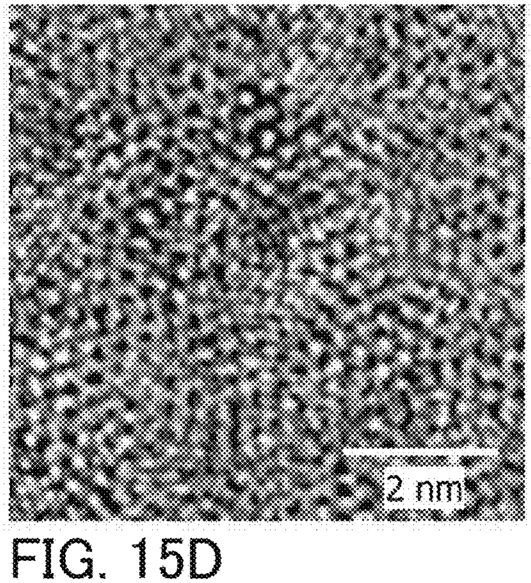
Figure 15C:
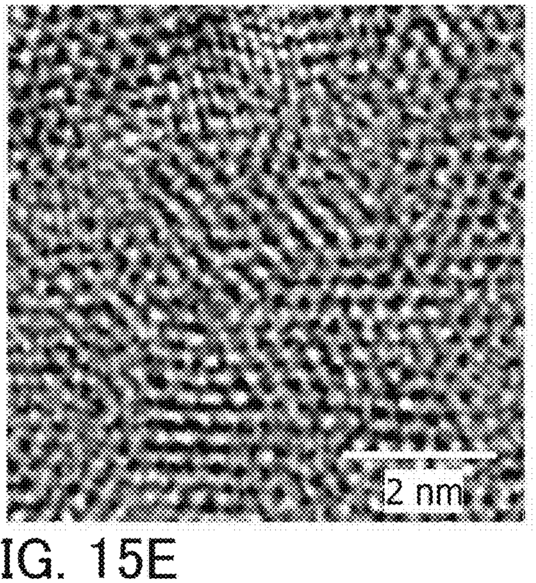
Figure 15D:
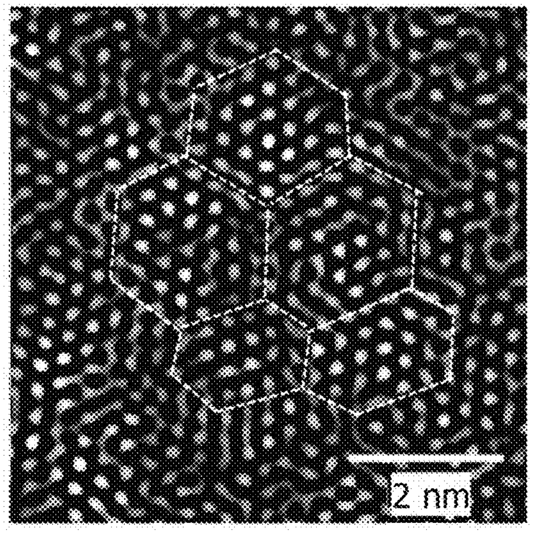
Figure 15E:
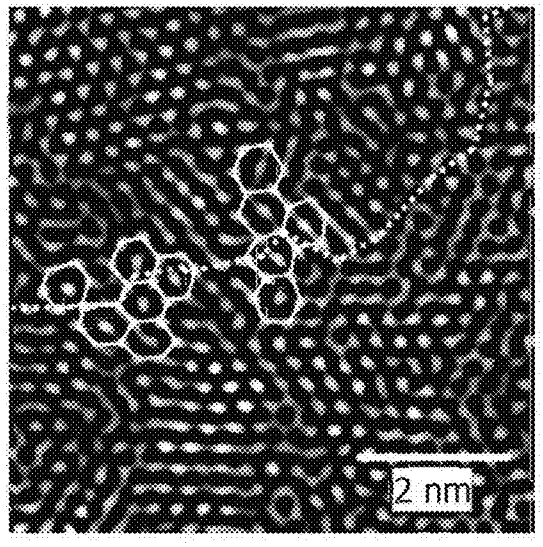

FIGS. 15B and 15C show Cs-corrected high-resolution TEM images of a plane of the CAAC-OS observed from the direction substantially perpendicular to the sample surface. FIGS. 15D and 15E are images obtained through image processing of FIGS. 15B and 15C. The method of image processing is as follows. The image in FIG. 15B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 15D, a portion where a lattice arrangement is broken is shown by a dashed line. A region surrounded by the dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 15E, a dotted line denotes a boundary between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

Analysis of an nc-OS by XRD will be described. When the structure of an nc-OS is analyzed by an out-of-plane method, a peak indicating orientation does not appear. That is, a crystal of an nc-OS does not have orientation.

Figure 16A:
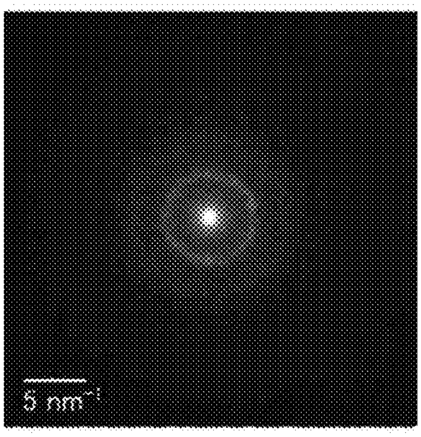
FIGS. 16A to 16D show electron diffraction patterns and a cross-sectional TEM image of an nc-OS.
Figure 16B:
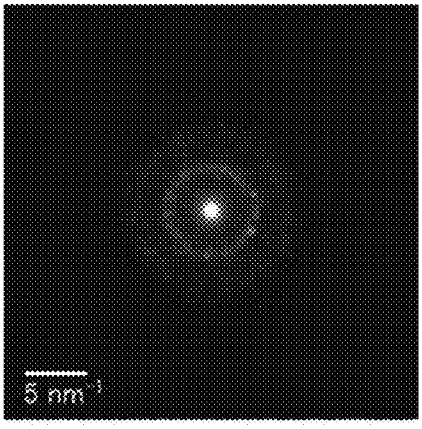

For example, when an electron beam with a probe diameter of 50 nm is incident on a 34-nm-thick region of thinned nc-OS including an $InGaZnO_4$ crystal in a direction parallel to the formation surface, a ring-like diffraction pattern (a nanobeam electron diffraction pattern) shown in FIG. 16A is observed. FIG. 16B shows a diffraction pattern obtained when an electron beam with a probe diameter of 1 nm is incident on the same sample. As shown in FIG. 16B, a plurality of spots are observed in a ring-like region. In other words, ordering in an nc-OS is not observed with an electron beam with a probe diameter of 50 nm but is observed with an electron beam with a probe diameter of 1 nm.

Figure 16C:
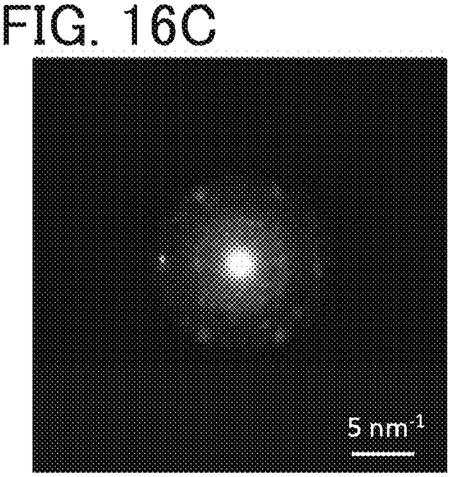

Furthermore, an electron diffraction pattern in which spots are arranged in an approximately hexagonal shape is observed in some cases as shown in FIG. 16C when an electron beam with a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 16D:
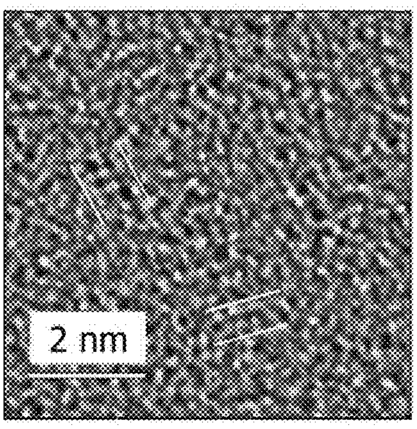

FIG. 16D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 16D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS film, for example, a grain boundary is not always found clearly. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

Figure 17B:
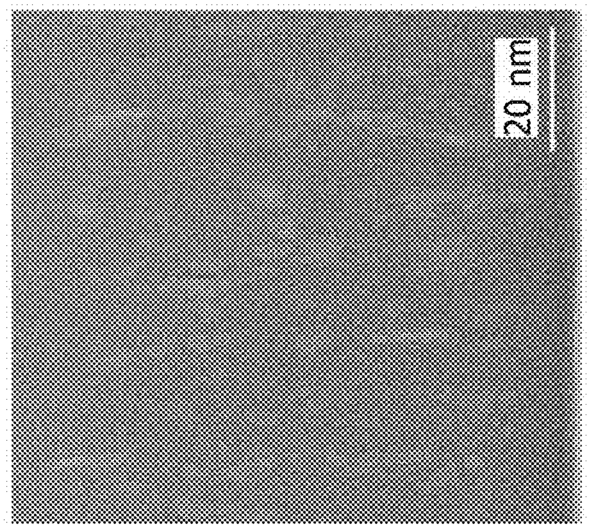
FIGS. 17A and 17B show cross-sectional TEM images of an a-like OS.
Figure 17A:
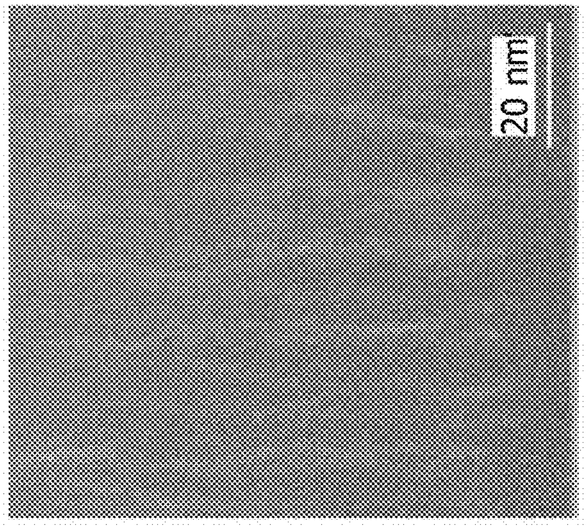

FIGS. 17A and 17B are high-resolution cross-sectional TEM images of an a-like OS. FIG. 17A is the high-resolution cross-sectional TEM image of the a-like OS at the start of the electron irradiation. FIG. 17B is the high-resolution cross-sectional TEM image of the a-like OS after the electron ($e^-$) irradiation at $4.3\times10^8$ $e^-/nm^2$. FIGS. 17A and 17B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. Accordingly, the spacing between these adjacent layers is equivalent to the lattice spacing (also referred to as d value) on the (009) plane. The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 18:
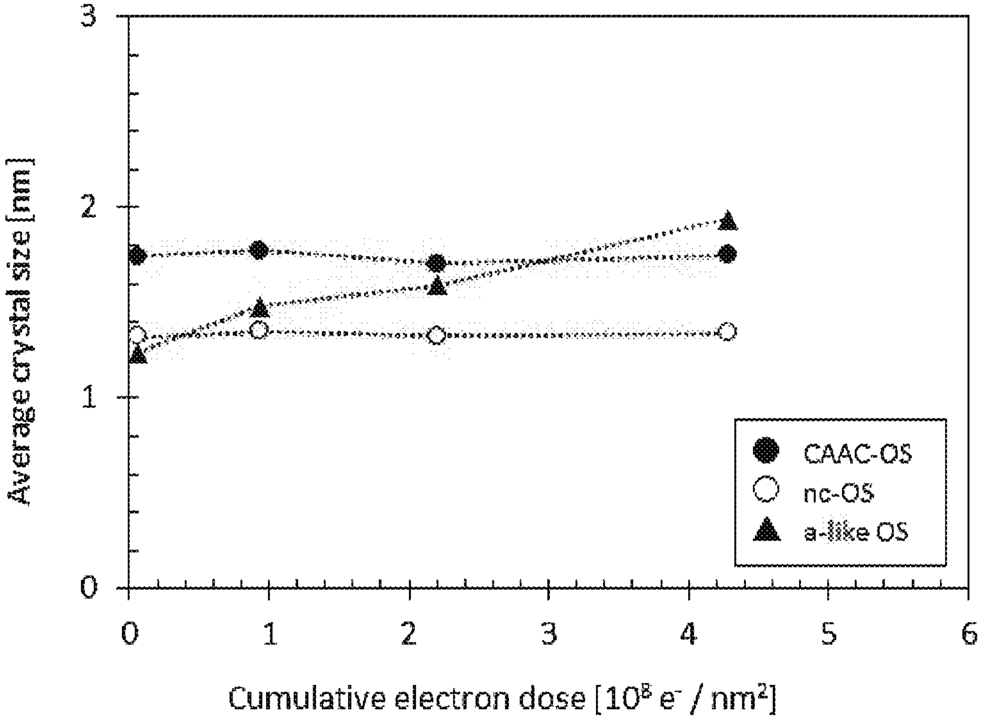
FIG. 18 shows a change of crystal parts of an In—Ga—Zn oxide owing to electron irradiation.

FIG. 18 shows change in the average size of crystal parts (at 22 points to 30 points) in each sample. Note that the crystal part size corresponds to the length of the lattice fringe. FIG. 18 indicates that the size of the crystal part in the a-like OS increases with an increase in the cumulative electron dose in obtaining TEM images, for example. As shown in FIG. 18, a crystal part of approximately 1.2 nm (also referred to as an initial nucleus) at the start of TEM observation grows to a size of approximately 1.9 nm at a cumulative electron ($e^-$) dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. As shown in FIG. 18, the crystal part sizes in an nc-OS and a CAAC-OS are approximately 1.3 nm and approximately 1.8 nm, respectively, regardless of the cumulative electron dose. For observation of electron beam irradiation and TEM, a Hitachi H-9000NAR transmission electron microscope was used. The conditions of electron beam irradiations were as follows: the accelerating voltage was 300 kV; the current density was $6.7\times10^5 e^-/(nm^2\times s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

This application is based on Japanese Patent Application serial No. 2015-106145 filed with Japan Patent Office on May 26, 2015, the entire contents of which are hereby incorporated by reference.

What is claimed is:

1. A semiconductor device comprising:

a substrate; and a memory cell string comprising a first memory cell over the substrate, wherein the first memory cell comprises a first transistor, wherein the first transistor comprises a first gate electrode, a gate insulating layer, a first oxide semiconductor layer, a source electrode, a drain electrode, and a back gate electrode, wherein a channel formation region of the first transistor is in the first oxide semiconductor layer, wherein a channel length direction of the first transistor is parallel to a first direction perpendicular to a top surface of the substrate, wherein a first conductor serving as the first gate electrode faces the channel formation region with the gate insulating layer therebetween, wherein a second conductor serving as the back gate electrode faces the channel formation, region with an insulator therebetween, wherein a third conductor serving as the source electrode faces a fourth conductor serving as the drain electrode with the gate insulating layer therebetween, wherein the third conductor is in contact with a first side surface of the first oxide semiconductor layer, wherein the fourth conductor is in contact with a second side surface of the first oxide semiconductor layer, and wherein the second conductor extends in the first direction.

2. The semiconductor device according to claim 1, further comprising a silicon transistor, wherein a channel formation region of the silicon transistor is in the substrate, and wherein the silicon transistor is electrically connected to the first memory cell.

3. A semiconductor device comprising:

a substrate;

a prism-like insulator over the substrate; and a memory cell string comprising a first memory cell on a first side surface of the prism-like insulator and a second memory cell on a second side surface of the prism-like insulator;

wherein the first memory cell comprises a first transistor, wherein the first transistor comprises a first gate electrode, a gate insulating layer, a first oxide semiconductor layer, a source electrode, a drain electrode, and a back gate electrode, wherein a channel formation region of the first transistor is in the first oxide semiconductor layer, wherein a channel length direction of the first transistor is parallel to a first direction perpendicular to a top surface of the substrate, wherein a first conductor serving as the first gate electrode faces the channel formation region with the gate insulating layer therebetween, wherein a second conductor serving as the back gate electrode faces the channel formation region with the prism-like insulator therebetween, wherein a third conductor serving as the source electrode faces a fourth conductor serving as the drain electrode with the gate insulating layer therebetween, wherein the third conductor is in contact with a first side surface of the first oxide semiconductor layer, wherein the fourth conductor is in contact with a second side surface of the first oxide semiconductor layer, and wherein the second conductor extends in the first direction.

4. The semiconductor device according to claim 3, further comprising a silicon transistor, wherein a channel formation region of the silicon transistor is in the substrate, and wherein the silicon transistor is electrically connected to the first memory cell.

* * * * *